(12) United States Patent
Pereira et al.

(10) Patent No.: US 6,493,793 B1
(45) Date of Patent: Dec. 10, 2002

(54) CONTENT ADDRESSABLE MEMORY DEVICE HAVING SELECTIVE CASCADE LOGIC AND METHOD FOR SELECTIVELY COMBINING MATCH INFORMATION IN A CAM DEVICE

(75) Inventors: Jose Pio Pereira, Santa Clara, CA (US); Varadarajan Srinivasan, Los Altos Hills, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 172 days.

(21) Appl. No.: 09/595,773

(22) Filed: Jun. 16, 2000

(51) Int. Cl.[7] ............................ G06F 13/00; G11C 15/00
(52) U.S. Cl. ............................ 711/108; 711/5; 365/49; 365/230.03
(58) Field of Search ................. 711/108, 5; 365/49, 365/230.03

(56) References Cited

U.S. PATENT DOCUMENTS

| | | | |
|---|---|---|---|
| 4,670,858 A | * 6/1987 | Almy | 365/4 |
| 4,758,982 A | * 7/1988 | Price | 711/108 |
| 4,845,668 A | 7/1989 | Sano et al. | 365/49 |
| 5,010,516 A | 4/1991 | Oates | 365/49 |
| 5,072,422 A | 12/1991 | Rachels | 365/49 |
| 5,440,715 A | 8/1995 | Wyland | 711/108 |
| 5,568,416 A | * 10/1996 | Kawana et al. | 365/49 |
| 5,621,677 A | 4/1997 | Jones | 365/49 |
| 5,649,149 A | 7/1997 | Stormon et al. | 711/108 |
| 5,841,874 A | 11/1998 | Kempke et al. | 713/160 |
| 5,860,085 A | 1/1999 | Stormon et al. | 711/108 |
| 5,930,356 A | * 7/1999 | Kempke et al. | 711/108 |
| 6,081,442 A | 6/2000 | Igarashi et al. | 365/49 |
| 6,122,707 A | 9/2000 | Schultz et al. | 711/108 |
| 6,148,364 A | 11/2000 | Srinivasan et al. | 711/108 |
| 6,230,236 B1 | * 5/2001 | Schultz et al. | 711/108 |
| 6,317,350 B1 | * 11/2001 | Pereira | 365/49 |

FOREIGN PATENT DOCUMENTS

| | | |
|---|---|---|
| EP | 07747758 | 5/1997 |
| EP | 0 646 930 | 1/2000 |

OTHER PUBLICATIONS

Patent Abstracts of Japan, "Associative Memory System," publication No. 08273376, and published Nov. 18, 1996.
Advance Information, Music Semiconductors, Oct. 1, 1998, Rev. 1b, MUAA Routing CoProccessor (RCP) Family.
Patent Abstracts of Japan, Pub. No. 08167295 entitled "Associative Memory", published Jun. 25, 1994.

(List continued on next page.)

Primary Examiner—Glenn Gossage

(57) ABSTRACT

A content addressable memory (CAM) device having an array including a plurality of rows of CAM cells each coupled to a match line; match flag logic having inputs coupled to the match line, and having an output to provide an internal match flag signal indicative of match conditions between a comparand word and data stored in the array; a plurality of match flag inputs to receive input match information from one or more other CAM devices; a match flag output to provide output match information to one or more other CAM devices; and cascade logic coupled to the plurality of match flag inputs and the match flag output for selecting which input match information received from the match flag inputs is logically combined with the internal match flag to generate the output match information.

40 Claims, 18 Drawing Sheets

OTHER PUBLICATIONS

"Response–Pipelined CAM Chips: The First Generation and Beyond", Kanad Ghose et al, IEEE 7th International Conference on VLSI Design, Jan. 1994, pp. 365–368.

"Pattern Addressable Memory", Ian N. Robinson, IEEE Microelectronics, Jun. 1992, pp. 20–30.

Preliminary Data Sheet, "MU9C2480 LANCAM", Music Semiconductors, 1995.

"The MU9C1480 LANCAM Hanbook", Music Semiconductors, Nov. 1994.

Functional Product Specification No. GPS–FPC–2800–12, "P2800 Multi–port Content Addressable Memory", GEC Plessey Semiconductors, Jan. 1996.

Preliminary, "KE5B064H Series Address Processor–Dual Port and Fixed Table Type", KLSI USA Inc., ver. 1.0.1, circa 1995.

Preliminary, "KE5B064A1 Address Processor", KLSI USA Inc., ver. 2.0.2. circa 1995.

"A Self–Testing Reconfigurable CAM", Anthony J. McAuley et al, IEEE Journal of Solid State Circuits, vol. 26, No. 3, Mar. 1991.

"High–Performance CAMs 10 GB/s and Beyond," Ken Shultz and Andres Sorowka, published in the Gigabit Ethernet Conference (GEC2000) on Mar. 27, 2000, pp. 147–154.

* cited by examiner

CONTENT ADDRESSABLE MEMORY DEVICE HAVING SELECTIVE CASCADE LOGIC AND METHOD FOR SELECTIVELY COMBINING MATCH INFORMATION IN A CAM DEVICE

BACKGROUND

1. Field of Invention

This invention relates generally to semiconductor memories and specifically to content addressable memories.

2. Description of Related Art

A content addressable memory (CAM) device is a storage device having an array of memory cells that can be instructed to compare the specific pattern of a comparand data with data words stored in corresponding rows of the array. The entire CAM array, or segments thereof, are searched in parallel for a match with the comparand data. If a match exists, the CAM device indicates the match condition by asserting a match flag, and may indicate the existence of multiple matches by asserting a multiple match flag. The CAM device typically includes a priority encoder that provides the highest priority matching address (e.g., the lowest CAM index) to a status register. The highest priority matching address, the contents of the matched location, and other status information (e.g., skip bit, empty bit, full flag, as well as match and multiple match flags) may be output from the CAM device to an output bus.

CAM devices may be depth cascaded together to form a larger CAM device or system. For example, two 1024 (1 k)×64 CAM devices may be depth cascaded together to form a 2 k×64 CAM device. Depth cascading may be implemented in a first configuration by forming a chain of CAM devices each having a match flag input pin and a match flag output pin, and for each CAM device, connecting its match flag output pin to the match flag input pin of the next CAM device. The first CAM device in the chain, which may represent the highest priority addresses (e.g., lowest CAM index), has its match flag input pin connected to a predetermined logic level to indicate that there is no previous CAM device. The match output pin of the last CAM device in the cascaded chain provides a system match flag indicative of match conditions in the CAM devices.

In response to a compare instruction, each CAM device simultaneously compares a comparand word with data stored in its respective CAM array. If a CAM device has a match, it forwards its asserted match flag to the next CAM device (e.g., the next highest priority CAM device). The CAM device may then output its match address to a common output bus, and the lower priority CAM device will be disabled from outputting data to the common output bus. If, however, the CAM device does not have a match, it will not assert its match flag output, and the lower priority CAM device may provide its match address to the common output data bus (if it has a match).

If there are many CAM devices depth cascaded together, then the lowest priority CAM device in the cascade will only be able to output its data to the common output bus if no other CAM devices in the cascade have a match. In this first prior art configuration, the lowest priority CAM device must wait until the match flag signals from the previous CAM devices have rippled through each device in the cascaded chain. This may result in an undesirably long time to generate the system match flag, and for the last CAM device to output data to the common output data bus. Since match flag information must ripple through each device in this cascaded system, the time required to generate the system match flag, as well as the time required for the last CAM device to resolve its match priority, is linearly related to the number of cascaded devices, and may be expressed as $t = t_{mf} + (n-1)\alpha$, where $t_{mf}$ is the time delay associated with generating a match flag for a CAM device, n is the number of cascaded devices, and a is the delay associated with combining match information from a previous CAM device with the internal match flag for the CAM device. Where many devices are cascaded in this manner, the time $t = t_{mf} + (n-1)\alpha$ may become large and no longer fit within a period of the system clock. As a result, the clock period may need to be increased to accommodate the delay in generating the system match flag and resolving priority, which in turn may adversely affect the operating frequency of the cascaded system.

One solution to increase speed is to provide the match flag of each CAM device to all lower priority devices in the cascaded chain. This second prior art configuration eliminates the gate delay associated with waiting for the higher priority match flags to ripple through the cascaded chain, but undesirably increases the number of match flag input pins required for each CAM device linearly with an increase in the number of cascaded devices. Since each CAM device would receive the match flags of all previous CAM devices in the chain, the last CAM device of such a system having n devices requires n−1 match flag input pins. Thus, although able to generate the system match flag much faster than the first prior art configuration, the second prior art configuration undesirably requires an additional match flag input pin for each additional cascaded device, and therefore consumes more silicon area than the first prior art configuration. In addition, connecting a match flag output pin to a match flag input pin of each lower-priority device may undesirably increase loading of the match flag output pin, which in turn may degrade performance.

Therefore, there is a need for a cascade configuration that achieves a balance between the number of match flag input pins required per cascaded device and the time required to generate a system flag for the cascaded devices.

SUMMARY

A method and apparatus are disclosed for hierarchically cascading a number of memory devices in a manner that achieves a balance between the number of match flag input pins and the time required to generate the system match flag. In some embodiments, the number of match pins required for each cascaded device and the time required to generate a system match flag are each logarithmically related to the number of cascaded devices. In one embodiment, an m-level hierarchy of groups are defined for up to n memory devices, where $m = \log_2 n$ and m is an integer greater than 2. The first hierarchy may include n/2 groups of 2 memory devices, the second hierarchy may include n/4 groups of 4 memory devices, and so on, where the last hierarchy may include one group of n devices. Each group in a given hierarchical level includes a pair of groups from the preceding hierarchical level. At each hierarchical level, the match flag generated by the first of the group's pair may be provided to the highest priority and the lowest priority device (e.g., the first and the last device) in the second of the group's pair. In some embodiments, the system match flag may be generated in a time $t = t_{mf} + m\alpha$, where $t_{mf}$ is the time required to generate a match flag, and $\alpha$ is the gate delay associated with logically combining an internal match flag with match flags received from other devices.

In other embodiments, at each hierarchical level, the match flag(s) generated by devices in the first of the pair defined in the previous hierarchical level are selectively provided to all devices in the second of the pair defined in the previous hierarchical level. In such embodiments, the selective interconnections made between groups defined in different hierarchical levels may allow for generating the system match flag and resolving priority amongst the CAM devices in a time $t=t_{mf}+m\alpha$.

In some embodiments, each CAM device includes cascade logic that allows input match information received from other (e.g., higher-priority) devices to be selectively combined with the device's internal match flag to generate output match information and/or to resolve priority. The output match information may be selectively combined with other match information in another (e.g., lower priority) device. The cascade logic includes a memory element for storing one or more select values that determine whether one or more corresponding input match flags received from other devices will participate with the device's internal match flag in generating the output match information. In one embodiment, the memory element is a look-up table that stores select values for all devices cascaded in the system and provides the select values to corresponding devices according to a unique device identification (ID) assigned to each device.

Other objects, features, and advantages of the present invention will be apparent from the accompanying drawings and from the detailed description that follows.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Embodiments of the present invention are discussed below in the context of content addressable memories (CAMS) for simplicity only. It is to be understood that embodiments of the present invention are equally applicable to cascading other memory devices including, for example, DRAM, SRAM, EEPROM, and so on. The interconnections between circuit elements or blocks may be shown as buses or as single signal lines, where each of the buses may alternatively be a single signal line, and each of the single signal lines may alternatively be a bus. Signals or pin names preceded by the symbol "/" are active low. Further, the logic levels assigned to various signals in the description below are arbitrary, and therefore may be modified (e.g., reversed polarity) as desired. In addition, although described herein with respect to match flag signals, present embodiments may be used to cascade other flags or signals including, for example, a multiple match flag, a full flag, or any signal indicating an operating state of a CAM device. Accordingly, the present invention is not to be construed as limited to specific examples described herein but rather includes within its scope all embodiments defined by the appended claims.

Figure 1:
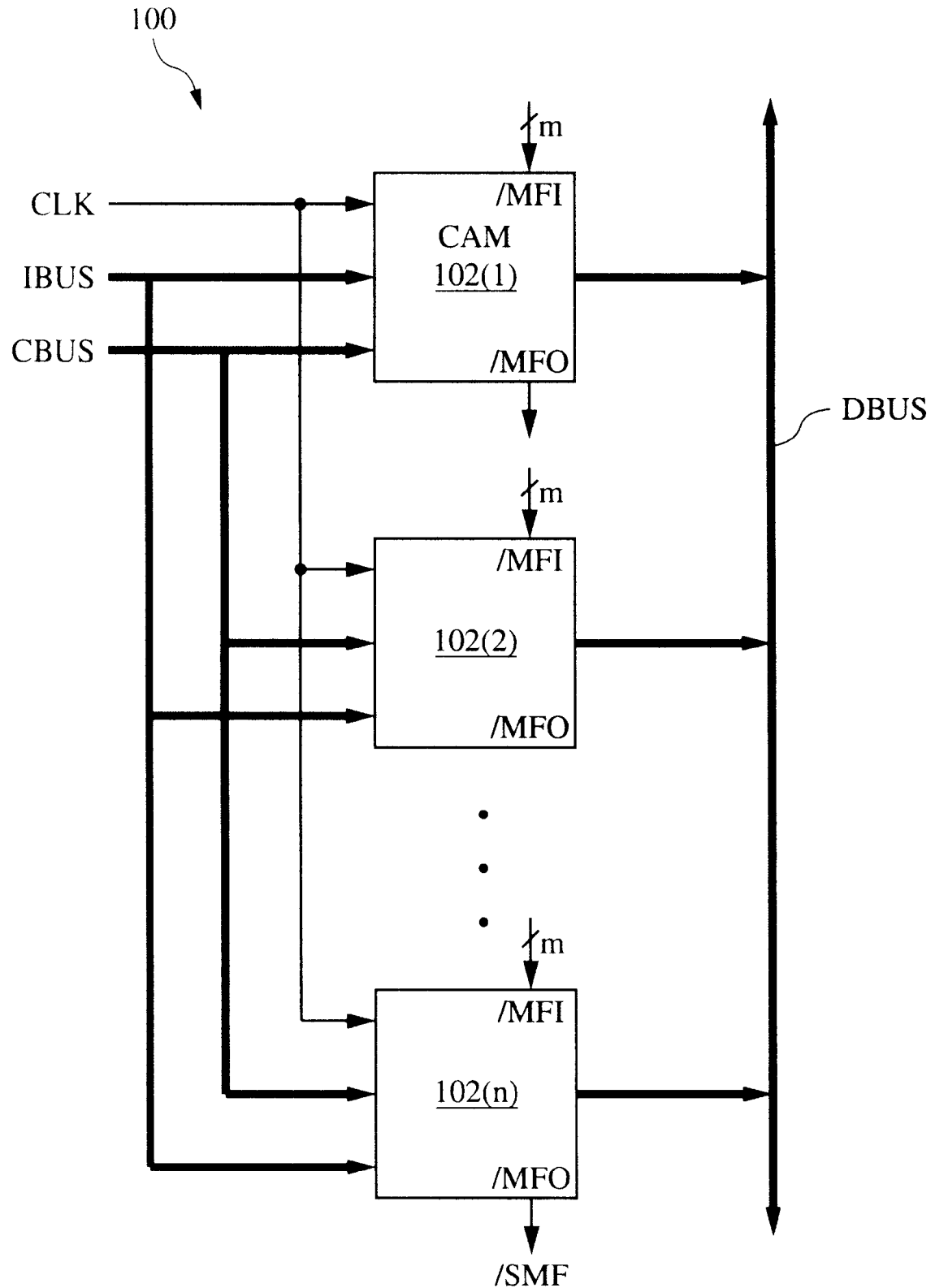
FIG. 1 is a block diagram of a system of cascaded CAM devices in which embodiments of the present invention may be implemented.

FIG. 1 shows a system 100 including a number n of CAM devices 102(1)–102(n) which may be selectively interconnected in a depth cascade configuration according to the present invention. Specific interconnections between the CAM devices 102(1)–102(n) may differ between the various embodiments, and are therefore not shown in FIG. 1. The total memory capability of system 100 is equal to the sum of the array sizes of the CAM devices 102(1)–102(n). Thus, for example, if there are n=8 CAM devices 102 and each CAM device 102 includes a 1 k×64 CAM array, then the system 100 may operate as an 8 k×64 CAM array. CAM devices 102 may be any suitable type of CAM device, including for example, synchronous or asynchronous CAM devices that include binary or ternary CAM arrays. The CAM devices 102 may be any suitable size, and may be of different widths.

For purposes of discussion herein, the first CAM device 102(1) in the cascaded system 100 is designated as the highest priority device, the second CAM device 102(2) is designated as the next highest priority device, and so on, where the last CAM device 102(n) is designated as the lowest priority device, although in actual embodiments priority may be reversed. In one embodiment where each CAM device 102 includes an array having 1 k rows, the highest priority CAM device 102(1) includes the lowest CAM addresses (i.e., CAM addresses 0 to 1 k−1), the next highest priority device 102(2) includes the next lowest Cam addresses (i.e., CAM addresses 1 k to 2 k−1), and so on, where the lowest priority CAM device 102(n) includes the highest CAM addresses (i.e., CAM addresses (n−1)k to (n)k).

Each CAM device 102 receives in parallel a clock signal CLK, comparand data from a comparand bus CBUS, and instructions from an instruction bus IBUS. In other embodiments, the comparand bus CBUS and instruction bus IBUS may be the same bus. Other well-known signals which may be provided to the CAM devices 102, such as word enable signals, reset signals, and enable signals, are not shown for simplicity. The CAMs 102 may output data and/or status information to a common data bus DBUS. The data output from the CAMs 102 to the data bus DBUS may include a matching CAM address and/or data stored in the CAM 102 or in an associated memory (not shown), while the status information may include a match flag, multiple match flag, full flag, skip bit, empty bit, and/or other information.

Each CAM device 102 is shown to include m match flag input pins /MFI to receive up to m match flags which may be indicative of match conditions in one or more previous (e.g., higher priority) CAM devices 102, and includes a match flag output pin /MFO to provide a match flag to one or more next (e.g., lower priority) CAM devices 102. For simplicity, the match flag input pins /MFI and their respective signal lines are represented collectively in FIG. 1. The first CAM device 102(1) may be designated as the highest priority device in the system 100 by connecting all of its match flag input pins /MFI to a power supply rail $V_{DD}$ to prevent their assertion to logic low. The match flag output pin /MFO of each CAM device 102 may be selectively connected to a corresponding match flag input pin /MFI of one or more lower priority CAM devices 102 in a cascade configuration such that the match flag output pin /MFO of the lowest priority device 102(n) provides a system match flag /SMF indicative of whether a match condition exists in any of CAM devices 102(1)–102(n), as described below with respect to various exemplary embodiments.

Figure 2:
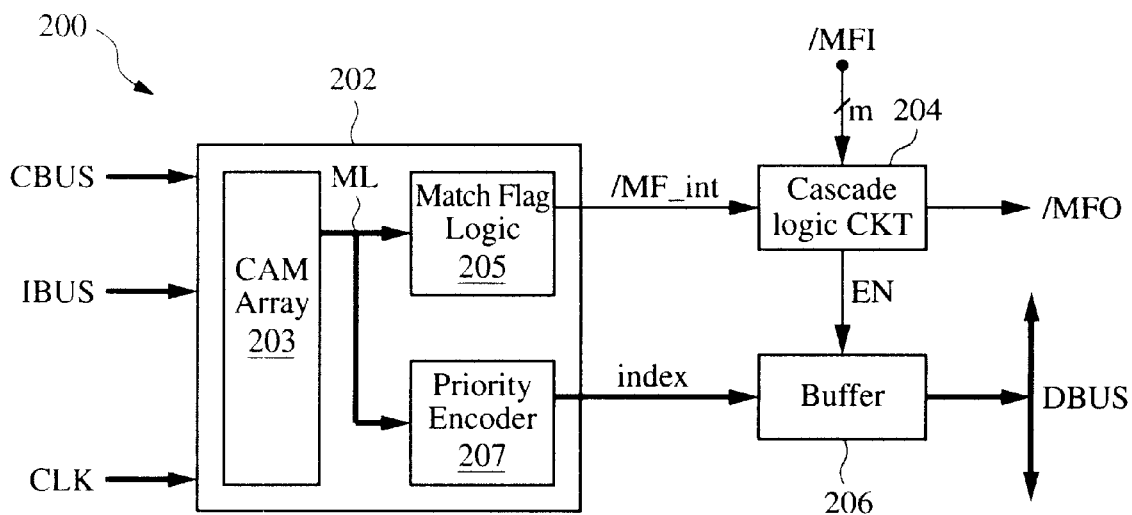
FIG. 2 is a block diagram of one embodiment of the CAM devices of FIG. 1.

FIG. 2 shows a CAM device 200 that is one embodiment of CAM device 102 of FIG. 1. The CAM device 200 has a CAM core 202, a cascade logic circuit 204, and a data buffer 206. The CAM core 202 includes a CAM array 203, match flag logic 205, and a priority encoder 207. CAM array 203 has a plurality of rows of CAM cells for storing a plurality of CAM words therein. Each row may also include one or more valid bits indicative of whether a valid CAM word is stored in the row. The valid bits may be used in a well-known manner to generate a full flag for the CAM block 102. In one embodiment, the CAM array includes 1 k (1024) rows of CAM cells each coupled to a corresponding match line (ML) that carries match signals indicative of match results between comparand data and data stored in a corresponding CAM row. Match flag logic 205 monitors the match signals and generates /MF_int. Priority encoder 207 also monitors the match signals and generates an index or address of the highest (or lowest) CAM row that stores data that matches the comparand data. Other well-known elements of the CAM device 200 such as, for instance, an instruction decoder, comparand register, address register, timing generator, multiple match logic, full flag logic, and so on, are not shown in FIG. 2 for simplicity.

The buffer 206, which may be any suitable data buffer, is coupled between CAM core 202 and DBUS, and includes a control terminal to receive an enable signal EN from cascade logic circuit 204. In response to a compare instruction received from IBUS, a comparand word provided on CBUS may be compared with words stored in the CAM array 203. If there is a match, an internal match flag /MF_int is asserted to logic low to indicate the match condition, and the index or address of a selected matching row is forwarded to the buffer 206. In one embodiment, the index of the highest priority match is provided to the buffer 206, where the highest priority match may be the lowest numbered address, the highest numbered address, or any other selected address. Corresponding data and/or status information may also be provided to the buffer 206. If there is not a match, /MF_int is de-asserted to logic high to indicate the mismatch condition.

The cascade logic circuit 204 combines the internal match flag /MF_int provided by CAM array 203 and any match information received from higher-priority CAM devices 102 via /MFI to generate an output match /MFO and to generate the enable signal EN for the buffer 206. /MFO indicates whether there is a match condition in associated CAM array 203 or in any previous CAM device 102, and may be provided to one or more lower priority CAM devices 102. /MFO is asserted to logic low if (1) there is a match condition in the corresponding CAM device, as indicated by MF_int, or (2) there is a match in a higher-priority CAM device, as indicated by /MFI. If there is not a match in the corresponding device or in any higher-priority CAM device, /MFO is de-asserted to logic high. EN is asserted to logic high to cause the buffer 206 to forward the index and any associated data or status information to DBUS if (1) there is a match in the associated CAM array 203 and (2) there is not a match in a higher priority device. Otherwise, EN is de-asserted to logic low to preclude buffer 206 from accessing DBUS. In this manner, EN may be used to ensure that only the index and any associated data or status information of the highest-priority matching row in all of CAM devices 102(1)–102(8) is provided to DBUS.

Figure 3:
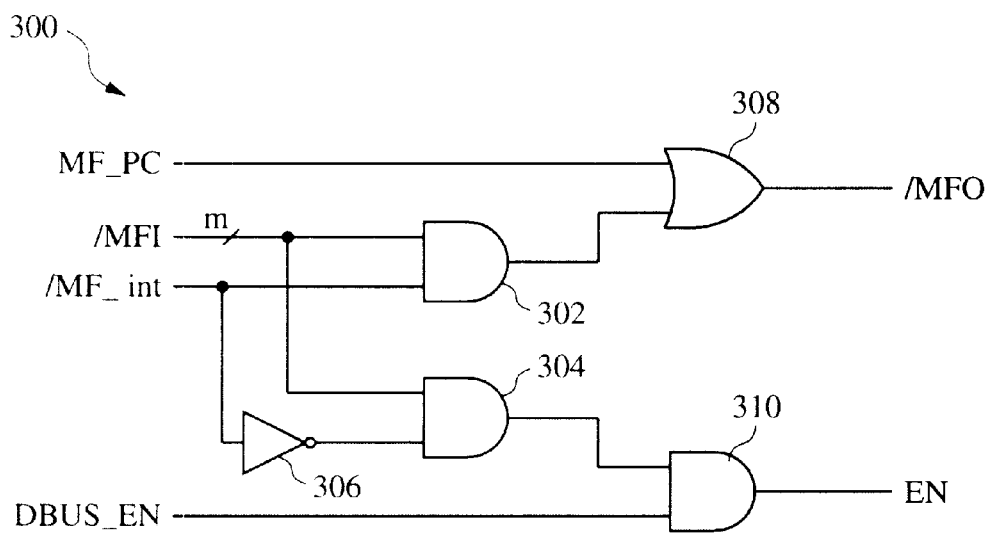
FIG. 3 is a logic diagram of one embodiment of the cascade logic circuit of the CAM device of FIG. 2.

FIG. 3 shows a cascade logic circuit 300 that is one embodiment of the cascade logic circuit 204 of FIG. 2. Cascade logic circuit 300 includes AND gates 302 and 304, an inverter 306, OR gate 308, and AND gate 310. AND gate 302 has one input terminal to receive /MF_int from CAM array 203 and m input terminals to receive up to m match flags from previous CAM devices via /MFI pins. OR gate 308 has a first input terminal coupled to an output terminal of AND gate 302, a second input terminal to receive a match flag pre-charge signal MF_PC, and an output terminal coupled to /MFO. AND gate 304 has one input terminal to receive a complement of /MF_int via inverter 306 and m input terminals to receive up to m match flags from previous CAM devices via /MFI pins. AND gate 310 has a first input terminal coupled to an output terminal of AND gate 304, a second input terminal to receive a DBUS enable signal DBUS_EN, and an output terminal to provide EN to buffer 206. Inverter 306 may be any well-known inverting circuit, and in one embodiment may be a Complementary Metal Oxide Semiconductor (CMOS) inverter.

MF_PC is asserted prior to or in response to a compare operation to pre-charge /MFO to logic high so as to initially indicate a mismatch condition. During the compare operation, MF_PC is de-asserted, and AND gate 302 asserts /MFO to logic low via OR gate 308 to indicate a match condition if /MF_int or any of /MFI are logic low. Conversely, if MF_int and all /MFI signals are logic high, AND gate 302 maintains /MFO in the logic high state to indicate the mismatch condition. If there is a match condition determined by AND gate 302, /MFO is discharged from logic high to logic low to indicate the match condition. Otherwise, if there is not a match condition, /MFO remains in the logic high state. In this manner, logic in the cascaded CAM system 100 may be configured to favor one logic translation, i.e., high-to-low logic transitions, which may improve speed.

DBUS_EN is a gating signal that selectively allows AND gate 304 to assert EN to logic high to allow corresponding buffer 206 access to DBUS. When DBUS_EN is de-asserted to logic low, EN is forced to logic low via AND gate 310, thereby preventing access to DBUS. When DBUS_EN is asserted to logic high, AND gate 304 asserts EN to logic high if (1) if there is a match condition in the corresponding CAM array 203, as indicated by a logic low /MF_int, and (2) there is not a match in any higher-priority devices, as indicated by logic high /MFI signals. Otherwise, if there is not a match in corresponding array 203 or if there is a higher-priority match, AND gate 304 does not assert EN to logic high. As explained in more detail below, DBUS_EN may be used to preclude cascade logic 300 from asserting EN to logic high until match information from all higher-priority CAM devices is received. In other embodiments, MF_PC and/or DBUS_EN may not be used, and thus OR gate 308 and/or AND gate 310 may be omitted from cascade logic circuit 300. For one embodiment, MF_PC and DBUS_EN may be generated by an instruction decoder (not shown) or other control logic.

Figure 4A:
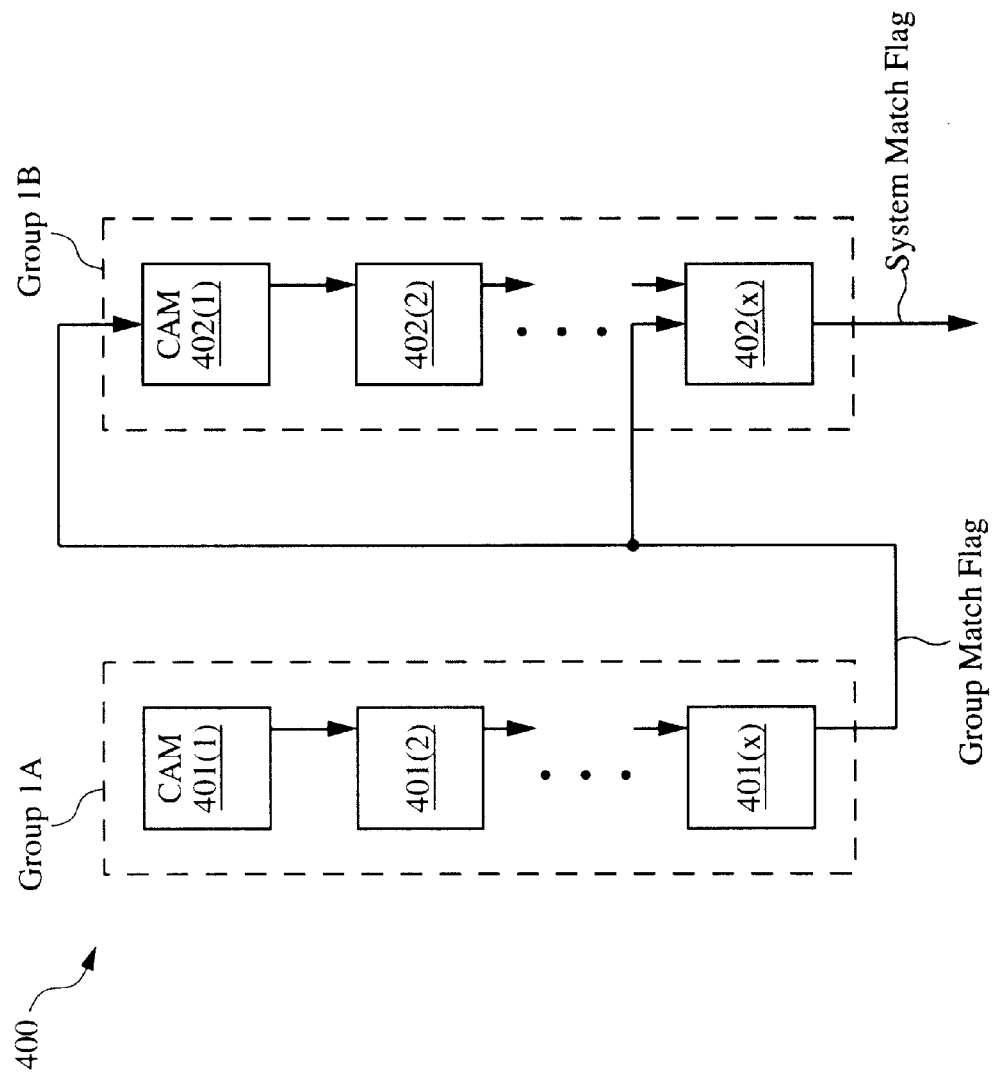
FIG. 4A is a simplified block diagram illustrating selective cascade connections between first and second groups of devices in a system in accordance with one embodiment of the present invention.

FIG. 4A shows a system 400 that illustrates a cascade configuration in one embodiment of the present invention. System 400 includes a first group (IA) having any number of CAM devices 401(1)–401(x), and a second group (2A) having any number of CAM devices 402(1)–402(x). In some embodiments, groups 1A and 1B may include different numbers of devices. In one embodiment, CAM devices 401 and 402 are CAM devices 102 and each include, for instance, cascade logic 300 described above with respect to FIG. 3, although other structures may be used. CAM devices 401(1)–401(x) are connected to one another in any manner to generate a group match flag for group 1A, and CAM devices 402(1)–402(x) are connected to one another in any manner to generate a group match flag for group 1B. The group match flags represent the combined match condition in all the CAM devices of the respective group (e.g., a logic OR of the match flags). In accordance with the present embodiment, the last device in the first group 1A, i.e., 401(x), which provides the group match flag for the first group 1A, is coupled to the first and last CAM devices in the second group 1B, i.e., to CAM devices 402(1) and 402(x).

Match information from the first group 1A is provided to the first device 402(1) and is thereafter rippled through all CAM devices 402 to alert CAM devices 402 of match conditions in group 1A. As discussed above with respect to FIGS. 2 and 3, each CAM device 402 in the second group needs to know if there is a match in any of the higher-priority CAM devices 401 in the first group 1A in order to determine whether to access DBUS. As a result, the last device 402(x) resolves priority at a time $t=t_{mf}+x\alpha$, where $t_{mf}$ is the time delay associated with generating an external match flag for a CAM device, n is the number of CAM devices, i.e., n=2×, and $\alpha$ is the delay associated with combining match information from a previous CAM device with the device's internal match flag.

Match information from the first group 1A is provided to the last device 402(x) in the second group 1B so that match information from group 1A does not have to ripple through all devices 402 in the second group 1B in order to generate the system match flag. In this manner, match information within respective groups 1A and 1B may be combined simultaneously, and then combined together in device 402 (x) to generate the system match flag. The system match flag may be generated for system 400 for 2x devices in a time $t=t_{mf}+(x-1)\alpha+\alpha=t_{mf}+x\alpha$. This is in contrast to the first prior art configuration in which match information ripples through all devices to generate the system match flag in a time $t=t_{mf}+(n-1)\alpha$. Thus, by providing CAM device 402 (x) with an additional match flag input pin to receive the group match flag from the first group 1A, the embodiment of FIG. 4A may generate the system match flag in approximately half the time, as compared to the first prior art configuration.

Figure 4B:
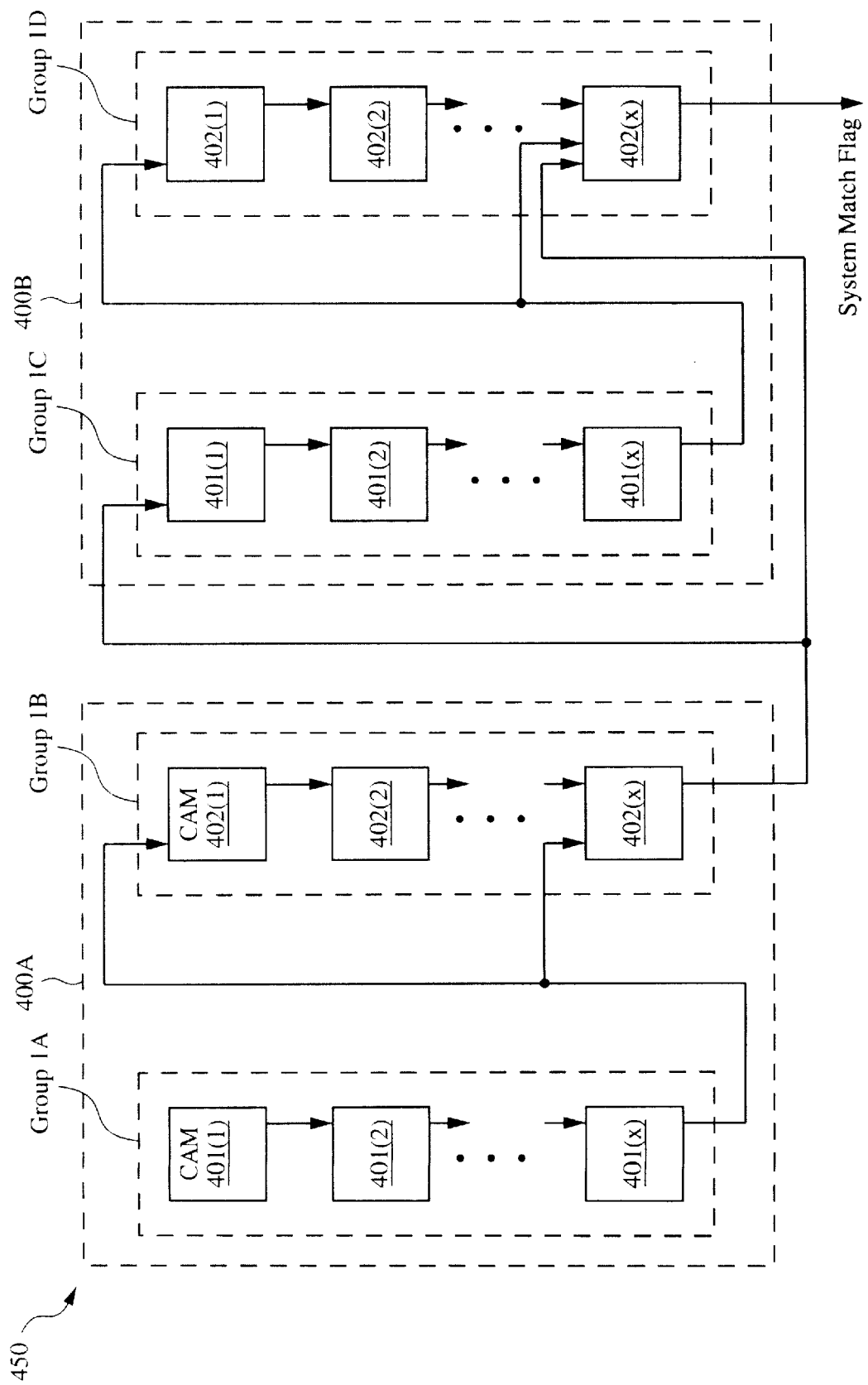
FIG. 4B is a simplified block diagram illustrating selective cascade connections between two systems of FIG. 4A in one embodiment of the present invention.

Two or more systems 400 may be cascaded together to form larger systems. The interconnections between the two or more systems 400 may be any suitable cascade configuration. In some embodiments, systems 400 are interconnected in the manner illustrated above with respect to FIG. 4A, e.g., where the last device in each system 400 is connected to the first and last device of a next system 400. For example, FIG. 4B shows a system 450 having two systems 400A and 400B of FIG. 4A cascaded together in accordance with one embodiment of the present invention, where system 400A includes groups 1A and 1B, and system 400B includes groups 1C and 1D, for a total of n=4× devices. Device interconnections within each system 400A and 400B are as shown in FIG. 4A. Match information from system 400A is provided to system 400B to resolve priority in the devices of system 400B and to generate the system match flag in the manner described above with respect to FIG. 4A. That is, the last device in system 400A is coupled to the first device and the last device in system 400B. Here, the last device in system 400B requires three /MFI pins, i.e., a first pin to receive match information from devices in its own group 1D, a second pin to receive match information from group 1C, and a third pin to receive match information from system 400A. Here, match information within each system 400A and 400B may be combined simultaneously, and then combined with each other in the last device of system 400B to generate the system match flag. Thus, the system match flag for the 4× devices of system 450 may be generated approximately one gate delay $\alpha$ after match information is available from each system 400A and 400B. In this manner, the number of devices may be doubled with only an additional $\alpha$ gate delay.

The device cascade interconnections shown in accordance with the embodiment of FIG. 4B may be described in terms of a hierarchical cascade configuration. As explained more fully below, in some embodiments, match information from CAM devices is combined using a hierarchical cascade configuration that allows for approximately logarithmic relationships between the number of CAM devices and the number of match flag input pins, and between the number of CAM devices and the time required to generate the system match flag. Referring again to FIG. 1, in some embodiments having up to n cascaded CAM devices 102, a number of unique groups are defined at each of $m=\log_2 n$ hierarchical levels. In one embodiment, the groups defined in each hierarchical level include a pair of groups defined in a previous hierarchical level, where each group in the first hierarchical level includes a pair of devices 102. Match information is combined within groups of each hierarchical level, and then combined between hierarchical levels to generate the system match flag.

Figure 5:
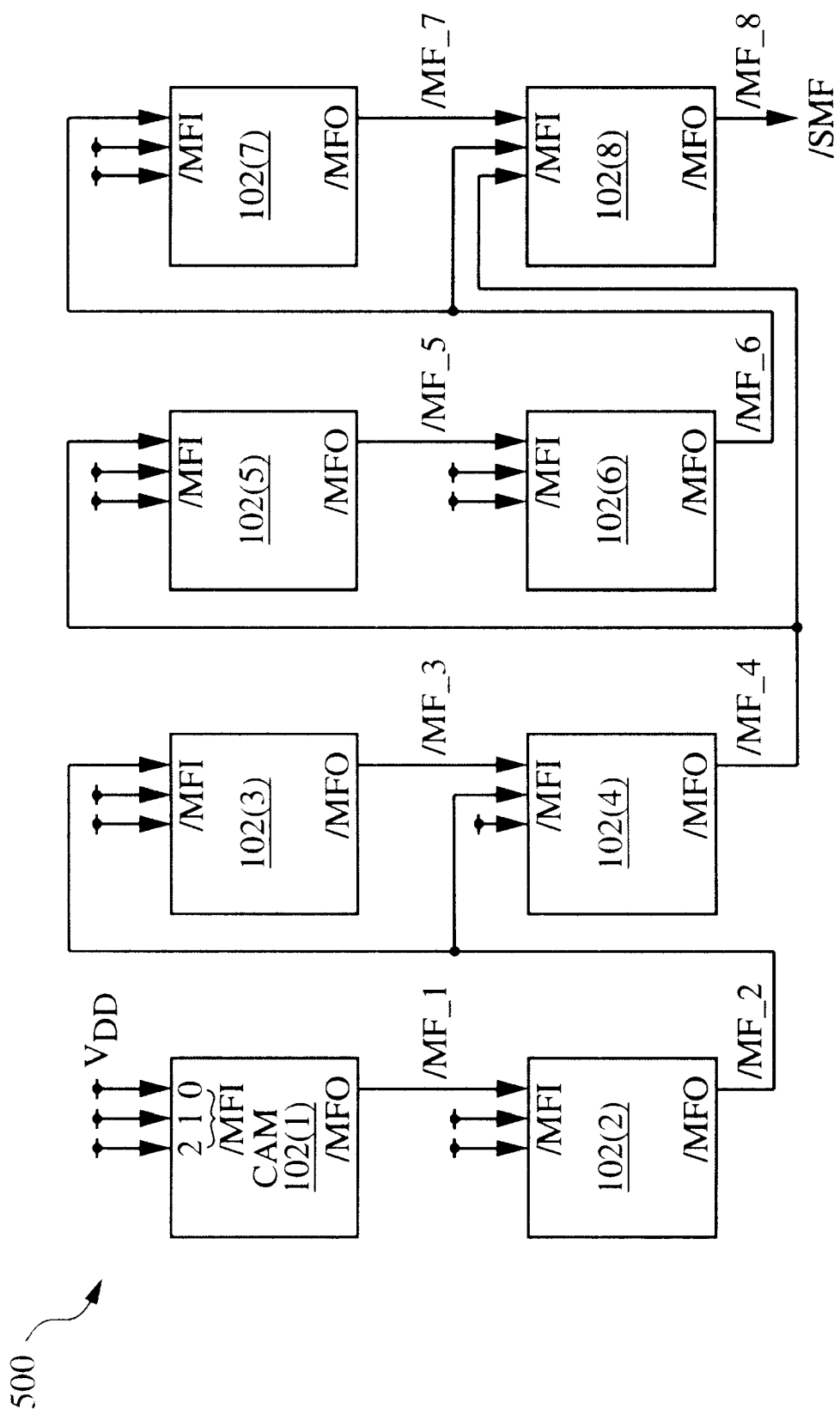
FIG. 5 is a block diagram illustrating selective cascade connections between eight CAM devices in one embodiment of the system of FIG. 1.

For example, FIG. 5 shows a system 500 having n=8 CAM devices 102 each having m=3 match flag input pins /MFI(0), /MFI(1), and /MFI(2) and a match flag output pin /MFO selectively interconnected in accordance with one embodiment of the present invention, where m=log$_2$n. Match flag signals from the CAM devices 102(1)–102(8) are combined within groups defined in each of m=3 hierarchical levels, where each group in a hierarchical level includes a pair of groups defined in a previous hierarchical level. Within each hierarchical level, the match flag generated by the first of the group's pair is provided to the first and last CAM device in the second of the group's pair. The output match flag provided at the /MFO pin of each device 102 is generated in response to its internal match flag /MF_int and any match flag signals received at its /MFI pins, as described above with respect to FIG. 3. Match flag input pins /MFI that do not receive a match flag from a higher-priority device are connected to V$_{DD}$.

Figure 6A:
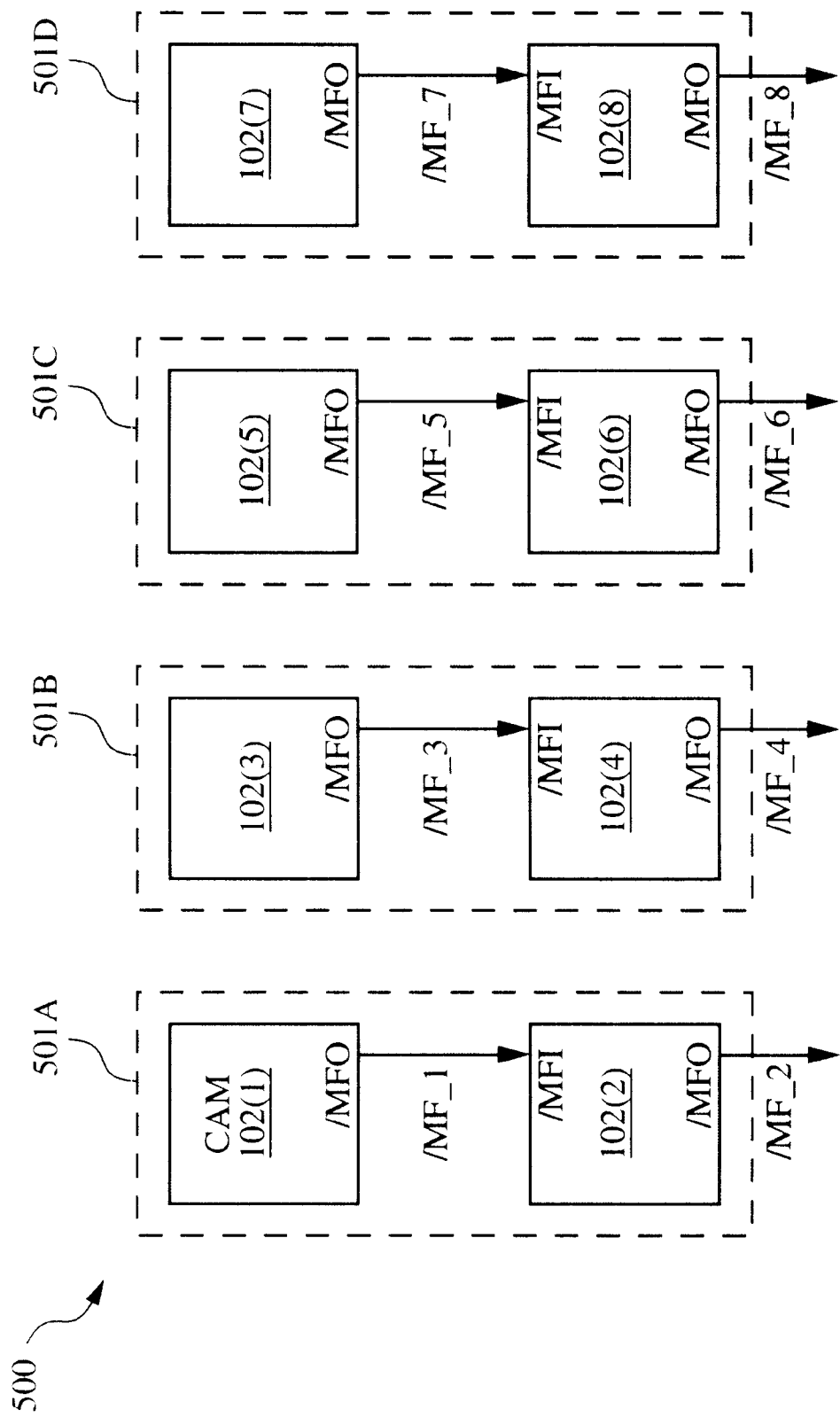
FIGS. 6A–6C illustrate a hierarchical cascading interconnection scheme used for the embodiment of FIG. 5.
Figure 6B:
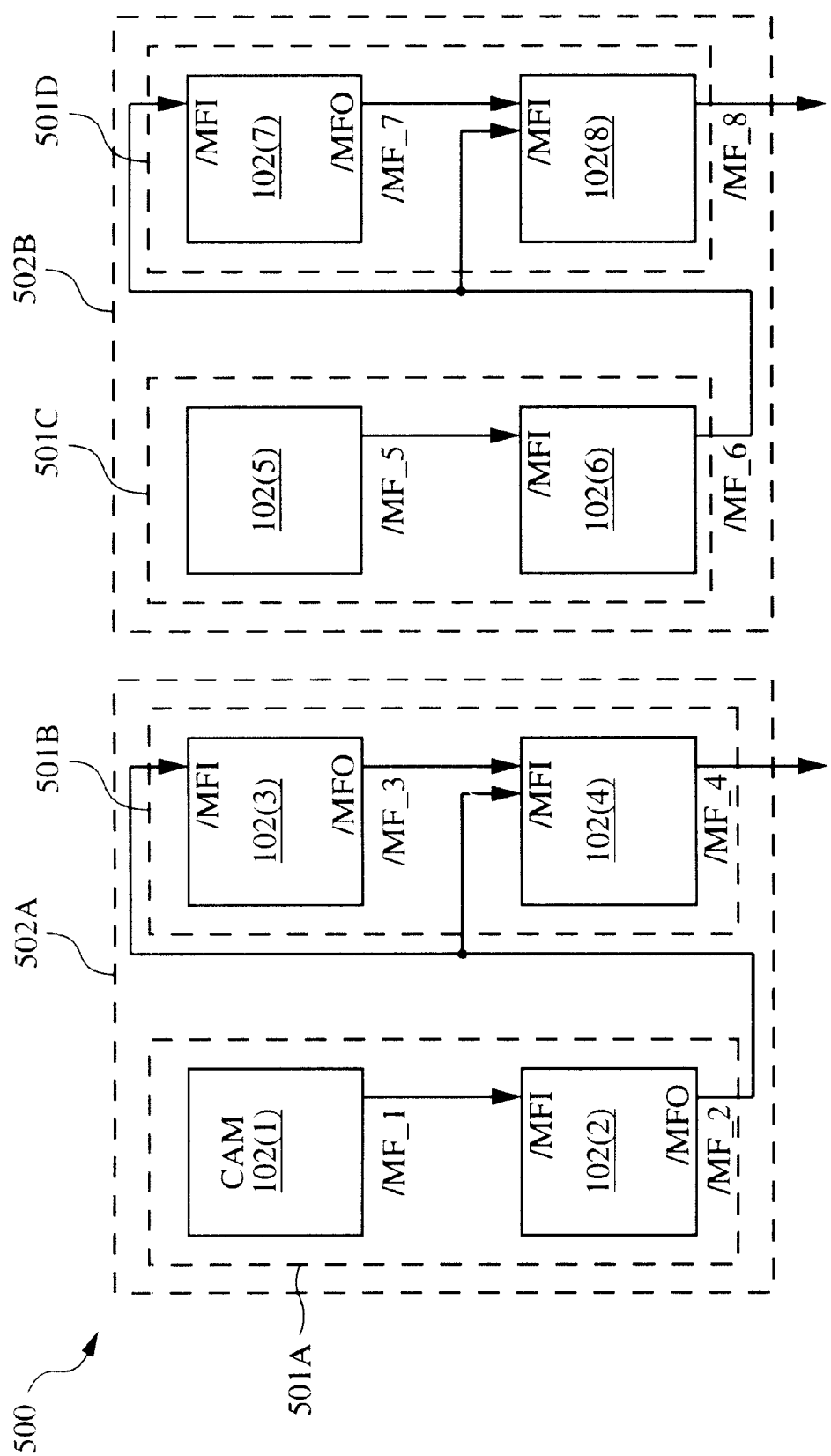
Figure 6C:
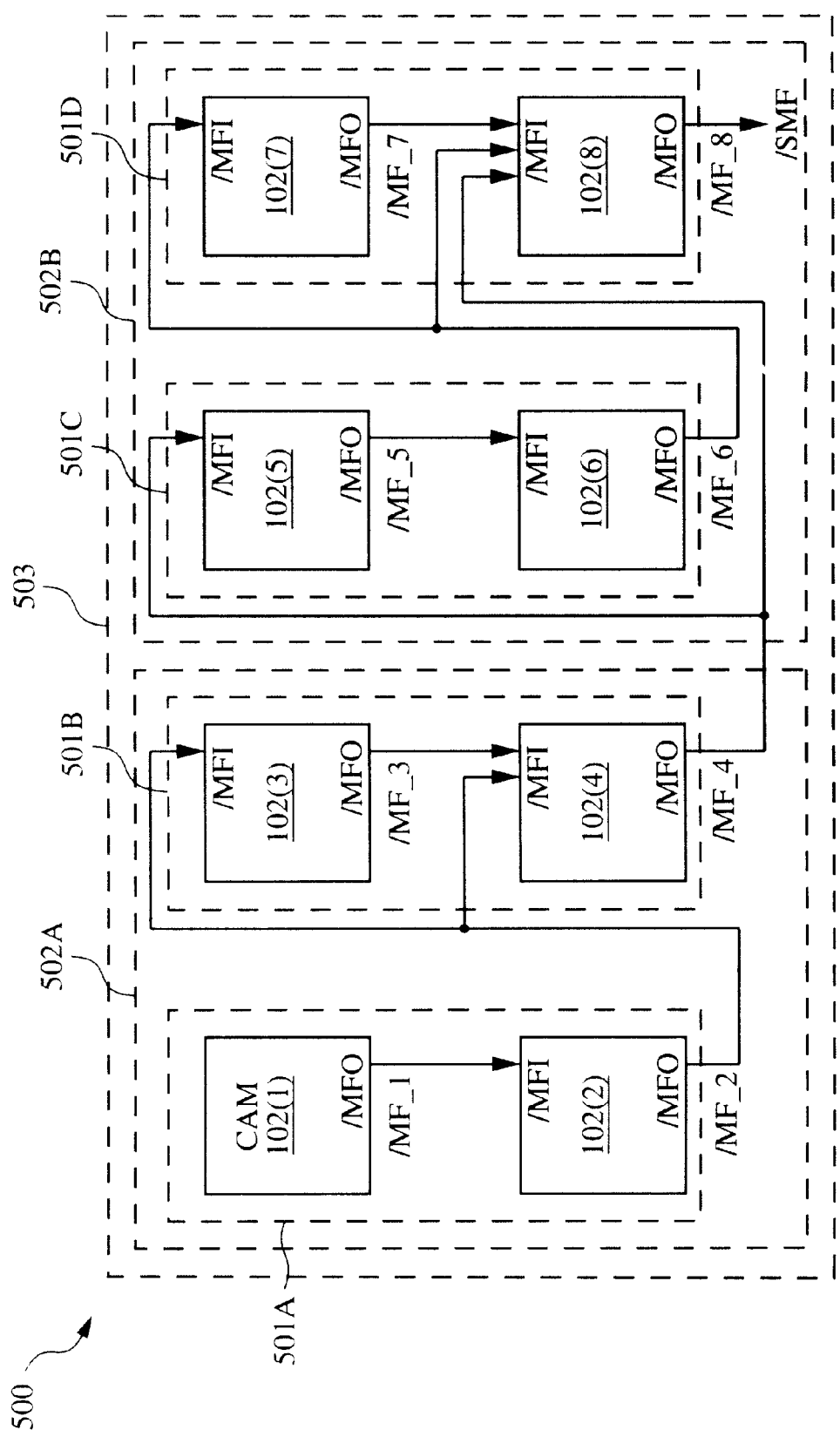

Selective interconnections within and between groups defined in the 3 hierarchical levels for the eight CAM devices 102(1)–102(8) of system 500 are illustrated in FIGS. 6A–6C, respectively. Referring to FIG. 6A, the first hierarchical level is defined to include 4 groups 501A–501D, each having a pair of the CAM devices 102. Within each of the groups 501A–501D, the match flag output from the higher priority device of the pair is connected to one of the /MFI pins of the lower priority device of the pair. For example, within the first group 501 A, the match flag /MF_1 output from device 102(1) is provided to an /MFI pin of device 102(2), where it is combined with device 102(2)'s internal match flag MF_int using cascade logic circuit 204 to generate at the /MFO pin of device 102(2) a match flag /MF_2 indicating whether a match condition exists within either device 102(1) or 102(2).

Referring to FIG. 6B, the second hierarchical level is defined to include 2 groups 502A and 502B, each including a pair of the groups 501 defined in the first hierarchical level. Within each of these groups 502A and 502B, the match flag output by the higher-priority group of the pair defined in the first hierarchical level is provided to an /MFI pin of the first and last CAM device in the lower-priority group of the pair. For example, the first group 502A of the second hierarchical level includes the pair of groups 501A and 501B defined in the first hierarchical level, i.e., CAM devices 102(1)–102(4). The /MFO pin of device 102(2) of the higher-priority group 501 A is connected to an /MFI pin of devices 102(3) and 102(4). The match flag /MF_2 is combined in device 102(4) with device 102(4)'s internal match flag MF_int and match flag /MF_3 from device 102(3) using cascade logic circuit 204 to generate at the /MFO pin of device 102(4) a match flag /MF_4 indicating whether a match condition exists in any of the CAM devices 102(1)–102(4), i.e., group 502A. Match flag information is combined within and cascaded between the CAM devices 102(5)–102(8) in a similar manner to generate at the /MFO pin of device 102(8) a match flag /MF_8 indicating whether a match condition exists in any of the CAM devices 102(5)–102(8), i.e., group 502B.

Referring to FIG. 6C, the third hierarchical level is defined to include one group 503 which includes the pair of groups 502A and 502B defined in the second hierarchical level. The match flag /MF_4 output by the higher-priority group 502A is provided to a match flag input pin of the first and last CAM device in the lower priority group 502B. Thus, the match flag /MF_4 output from device 102(4) is provided to respective /MFI pins of CAM devices 102(5) and 102(8). The match flag /MF_4 is combined in device 102(8) with device 102(8)'s internal match flag MF_int, match flag /MF_6 from device 102(6), and match flag /MF_7 from device 102(7) using cascade logic circuit 204 to generate at the /MFO pin of device 102(8) a match flag /MF_8 indicating whether a match condition exists in any of the CAM devices 102(1)–102(8), thereby providing the system match flag /SMF.

Figure 7:
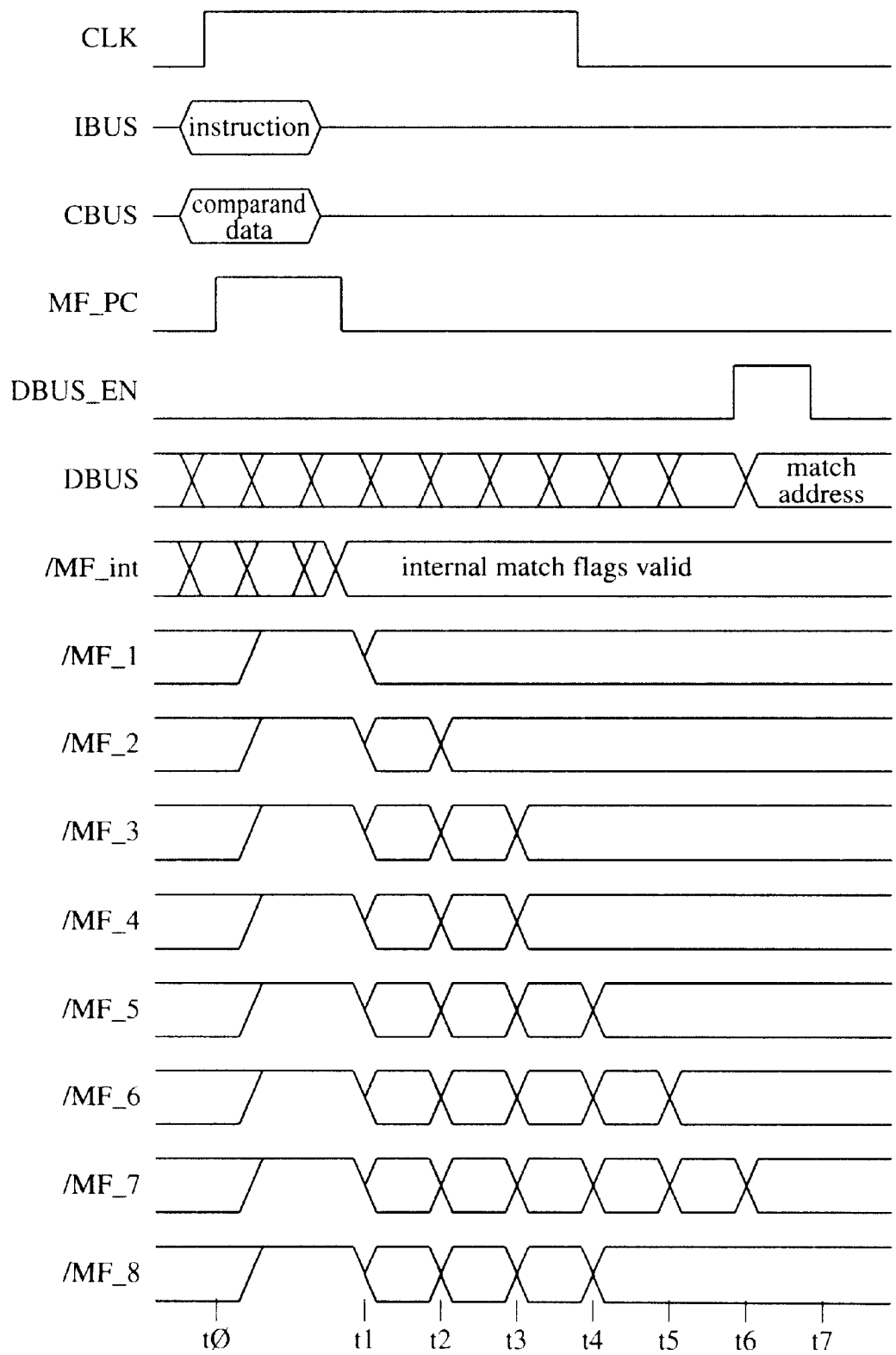
FIG. 7 is a timing diagram of one embodiment of the match flag signals generated by the CAM devices of FIG. 5.
Figure 10:
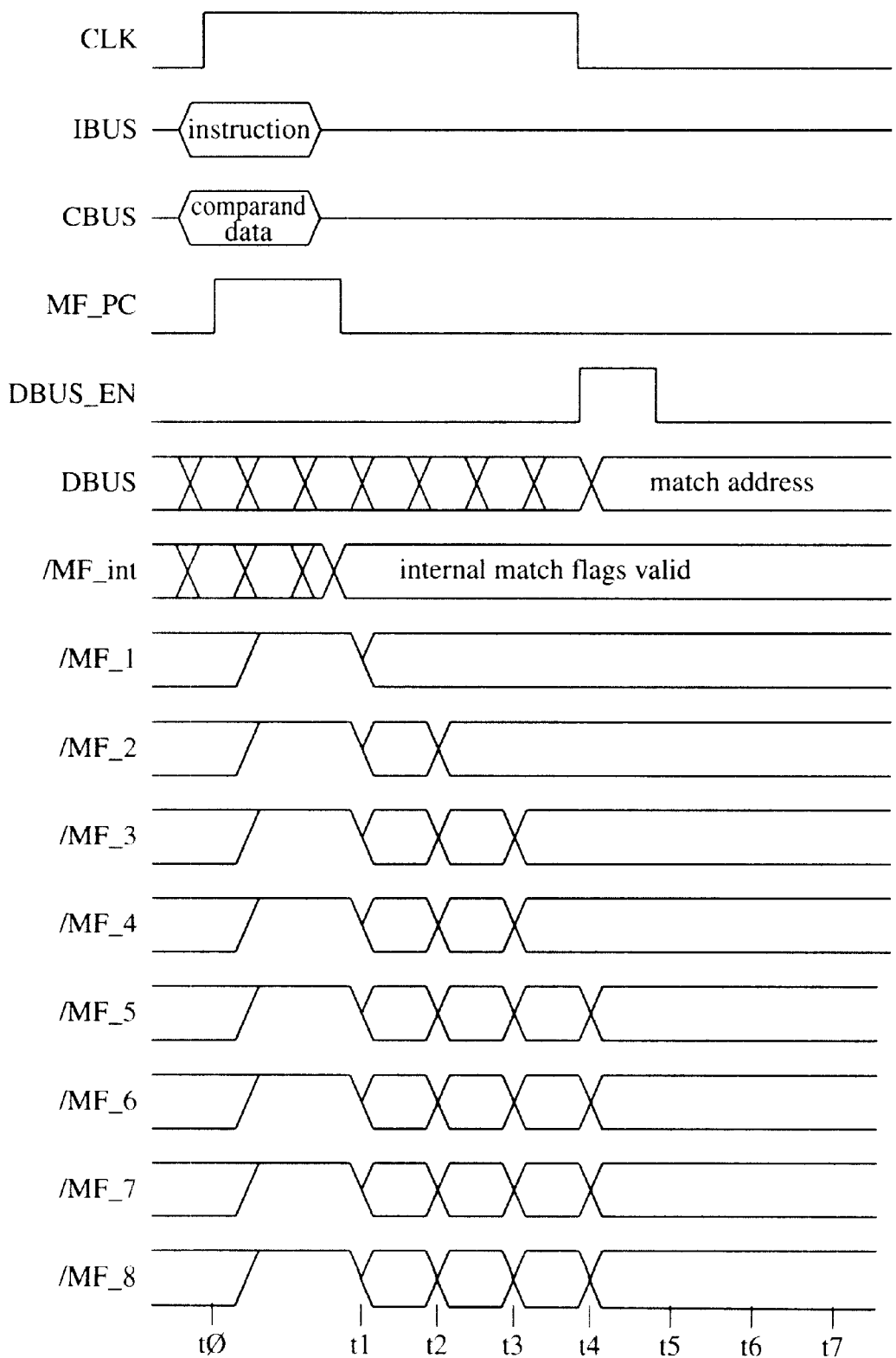
FIG. 10 is a timing diagram of one embodiment of the cascade signals generated by the CAM devices of FIG. 9.
Figure 13:
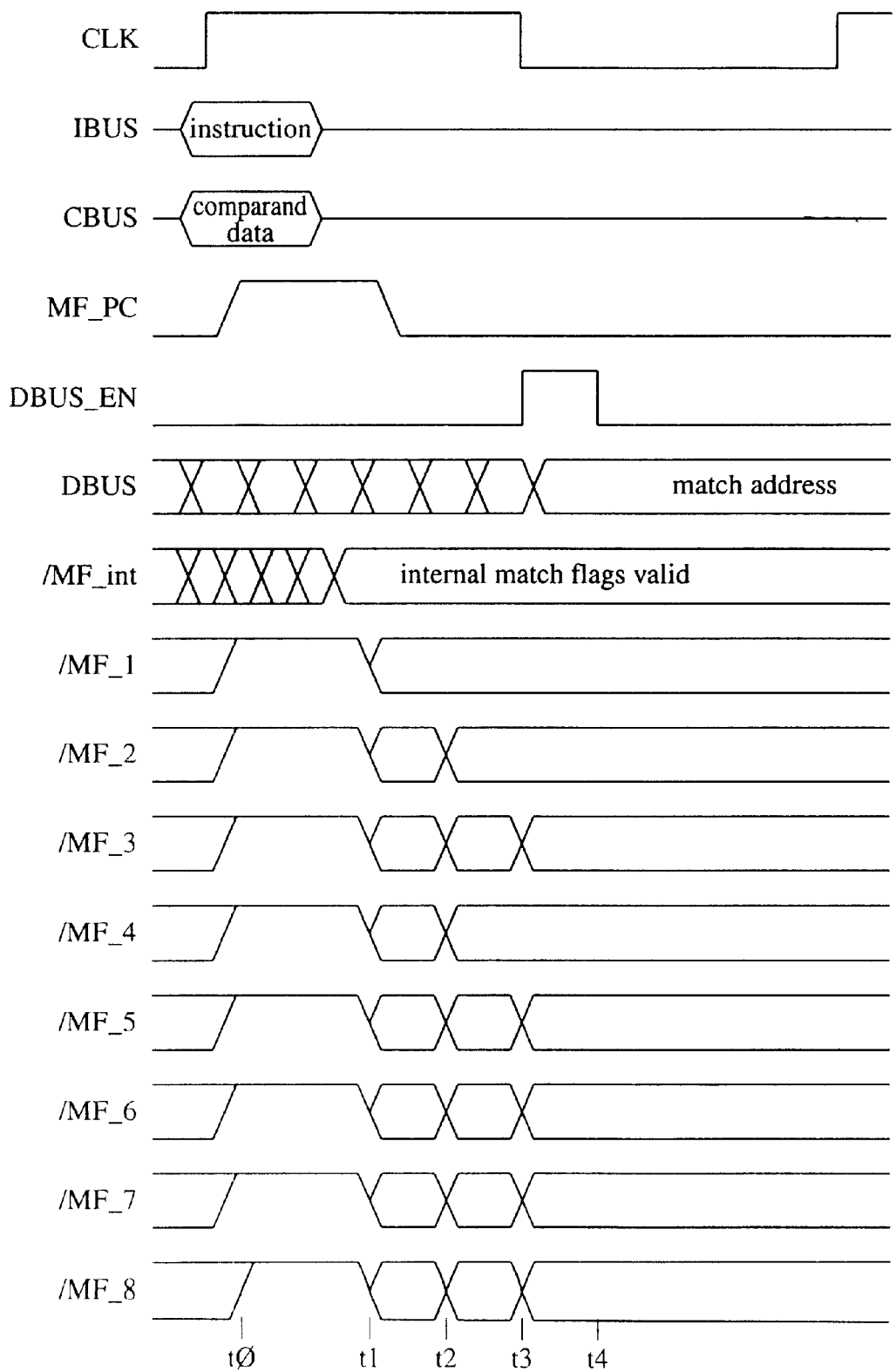
FIG. 13 is a timing diagram of one embodiment of the cascade signals generated by the CAM devices of FIG. 12.

The operation of system 500 may be illustrated with the aid of the exemplary timing diagram of FIG. 7, and with reference to FIGS. 1–3 and 5. Note that the timing diagrams of FIGS. 7, 10, and 13 show the system match flag resolved in a single clock cycle. For other embodiments, the system match flag, or other match flags, may be resolved in later clock cycles. Additionally, /MFO, DBUS, or EN of FIG. 3 may be clocked signals.

At time t0, CLK transitions to a logic high state enabling CAM devices 102(1)–102(8) to load an instruction from IBUS and comparand data from CBUS. MF_PC is pulsed to logic high to pre-charge all /MFO pins to logic high, thus initially indicating mismatch conditions for all CAM devices 102(1)–102(8). DBUS_EN is de-asserted to logic low to prevent each CAM device 102(1)–102(8) from accessing DBUS before priority is resolved in all devices. Each CAM device 102(1)–102(8) simultaneously compares the comparand word with entries in its array 203. By time t1, each CAM device 102 in the system 500 has generated an internal match flag /MF_int in response to the compare operation. For each CAM device 102, if there is a match condition, the /MFO pin is discharged to logic low. Conversely, if there is not a match condition, the /MFO pin remains charged in the logic high state. The time lapsed between times t0 and t1 is the match flag delay t$_{mf}$.

Initially, each CAM device 102 provides its internal match flag /MF_int as the output match flag /MF at its /MFO pin, since match information has not yet been provided from higher-priority devices. Since device 102(1) is the highest-priority device and thus does not receive match information from other devices, priority is resolved for device 102(1) at time t1, as indicated by the steady state waveform for /MF_1 in FIG. 7. However, since match information from higher-priority devices has not yet been combined in devices 102(2)–102(8), priority is not yet resolved for devices 102(2)–102(8). Thus, each device 102(2)–102(8) must wait for match information from all higher-priority devices in order to determine priority so that only the highest-priority CAM device 102 having a match condition in system 500 is able to access and provide a match address and any associated data and/or status information to DBUS. Accordingly, respective match flags /MF_2 to /MF_8 may subsequently change logic states in response to match information from higher-priority devices, and therefore have not yet reached the steady state, as indicated in FIG. 7. For example, since match information from device 102(1) has not yet been provided to device 102(2), device 102(2). cannot yet determine whether there is a match in higher-priority devices, i.e., in device 102(1), and thus /MF_2 is not yet in its steady state.

By time t2, the match flags /MF_1, /MF_3, /MF_5, and /MF_7 are combined in respective devices 102(2), 102(4), 102(6), and 102(8) with their respective internal match flags /MF_int to update respective match flags /MF_2, /MF_4, /MF_6, and /MF_8, each of which now indicates match conditions for their respective groups defined in the first hierarchical levels. For example, by time t2, /MF_2 indicates whether a match condition exists in either device 102(1) and 102(2) of group 501A. Similarly, by time t2, /MF_4 indicates whether a match condition exists in either device 102(3) and 102(4) of group 501B. Since /MF_2 now includes match information from all higher-priority devices, i.e., device 102(1), priority is resolved in CAM device 102(2), and /MF_2 is therefore now in a steady state, as indicated in FIG. 7. However, since the steady state /MF_2 has not yet been combined in any lower priority devices 102(3)–102(8), priority is not yet resolved in devices 102(3)–102(8), as indicated in FIG. 7. The time lapsed between times t1 and t2 is approximately equal to the gate delay α of the cascade logic circuit 204. Thus, $t2=t1+\alpha=t_{mf}+\alpha$.

By time t3, /MF_2 has been combined in devices 102(3) and 102(4) with their respective internal match flags /MF_int to update respective output match flags /MF_3 and /MF_4, and match flag /MF_6 has been combined in devices 102(7) and 102(8) with their respective internal match flags /MF_int to update respective output match flags /MF_7 and /MF_8. Thus, /MF_4 now indicates whether a match condition exists in any of devices 102(1)–102(4). Priority is also resolved in devices 102(3) and 102(4) at time t3, as indicated in FIG. 7 by the steady states of /MF_3 and /MF_4. /MF_8 now indicates whether there is a match condition in any group 502B device 102(5)–102(8). However, since stable match information from group 502A devices 102(1)–102(4) is not yet provided to group 502B devices 102(5)–102(8), priority is not yet resolved for devices 102(5)–102(8), as indicated by /MF_5 to /MF_8 in FIG. 7. The time lapsed between times t2 and t3 is approximately equal to α where $t3=t_{mf}+2\alpha$.

By time t4, /MF_4 has been combined in device 102(5) and device 102(8). /MF_4 is combined in device 102(8) with match information from group 502B devices 102(5)–102(8) to generate /SMF, which now indicates whether a match exists in any device 102(1)–102(8) in the system 400. Thus, /SMF is generated by time t4. The time lapsed between times t3 and t4 is approximately equal to α where $t4=t_{mf}+3\alpha$. /MF_4 is combined in device 102(5) to resolve priority in device 102(5) by time t4, as indicated by the steady state of /MF_5 in FIG. 7. However, since stable match information from group 502A devices is not yet combined in devices 102(6) and 102(7), priority is not yet resolved in devices 102(6) and 102(7).

By time t5, /MF_4 has rippled through device 102(5) and been combined in device 102(6) to resolve priority in device 102(6), as indicated by the steady state of /MF_6 in FIG. 7. The time lapsed between times t4 and t5 is approximately equal to α where $t5=t_{mf}+4\alpha$.

By time t6, /MF_4 has rippled through device 102(6) and been combined in device 102(7) to resolve priority in device 102(7), as indicated by the steady state of /MF_7 in FIG. 7. The time lapsed between times t6 and t7 is approximately equal to α where $t6=t_{mf}+5\alpha$. After priority is resolved in device 102(7), DBUS_EN is asserted to logic high to enable the buffer 206 of the highest-priority CAM device 102 having a match condition to provide the address of that match condition, along with any associated data and/or status information, to DBUS.

As described above, hierarchical cascade configurations of present embodiments generate the system match flag /SMF in an amount of time that is approximately logarithmically related to the number of cascaded devices in the system. For example, referring again to FIG. 5, the match flag /MF_2 is valid to indicate match conditions in two devices 102(1) and 102(2) after a delay $t2=t_{mf}+\alpha$. The match flag /MF_4 is valid to indicate match conditions in four devices 102(1)–102(4) after a delay $t3=t_{mf}+2\alpha$. The match flag /MF_8 is valid to indicate match conditions in eight devices 102(1)–102(8) after a delay $t3=t_{mf}+3\alpha$. In these embodiments, the delay in generating the system match flag /SMF for a system having n devices cascaded as described above may be generated after a delay $t(n)=t_{mf}+m\alpha$ using m input match pins in each device, where $m=\log_2 n$, and n=number of CAM devices. In one embodiment, where the time delay $t_{mf}=5$ ns and the time delay $\alpha=1.5$ ns, the system match flag /SMF may be generated for 8 devices cascaded according to the embodiment of FIG. 4 in approximately $t(8)=t_{mf}+(m-1)\alpha=5+(3)(1.5)=9.5$ ns.

In contrast to prior art cascade configurations, embodiments of the present invention achieve a balance between the time required to generate a system match flag and the number of match flag input pins required, thereby achieving balance between speed and size. For example, although a prior art cascade configuration in which the match flag output from each device is provided only to the match flag input of the next device requires only one match flag input pin per device, since match conditions the highest priority device must ripple through each device in the system to participate in the generation of the system match flag, the time required to generate the system match flag increases linearly with an increase in the number of devices in the system. The relationship between the number n of devices and time t(pa) required to generate the system match flag of this prior art configuration may expressed as $t(pa)=t_{mf}+(n-1)\alpha$. Thus, if $t_{mf}=5$ ns and $\alpha=1.5$ ns, such a prior art configuration of 8 devices would require a delay of approximately $t(pa)=t_{mf}+7\alpha=15.5$ ns to generate the system match flag, in contrast to the delay of 9.5 ns achieved by present embodiments of the FIG. 5. The ability to generate the system match flag more quickly that in this prior art system allows cascaded systems configured in accordance with present embodiments to operate at a higher frequency.

Further, although a prior art cascade configuration in which the match flag output from each device is provided as a match flag input to each subsequent device achieves a gate delay of approximately $t_{mf}+\alpha$, since each device receives the match flag of all previous devices, the number of match flag input pins increases linearly with an increase in the number of devices in the system. The relationship between the number n of devices and number m(pa) of match flag input pins required for each device in this prior art configuration may expressed as $m(pa)=n-1$. For example, such a configuration of 8 devices requires 7 input pins, in contrast to the $m=\log_2 n=3$ match flag input pins used in present embodiments discussed above.

Figure 8:
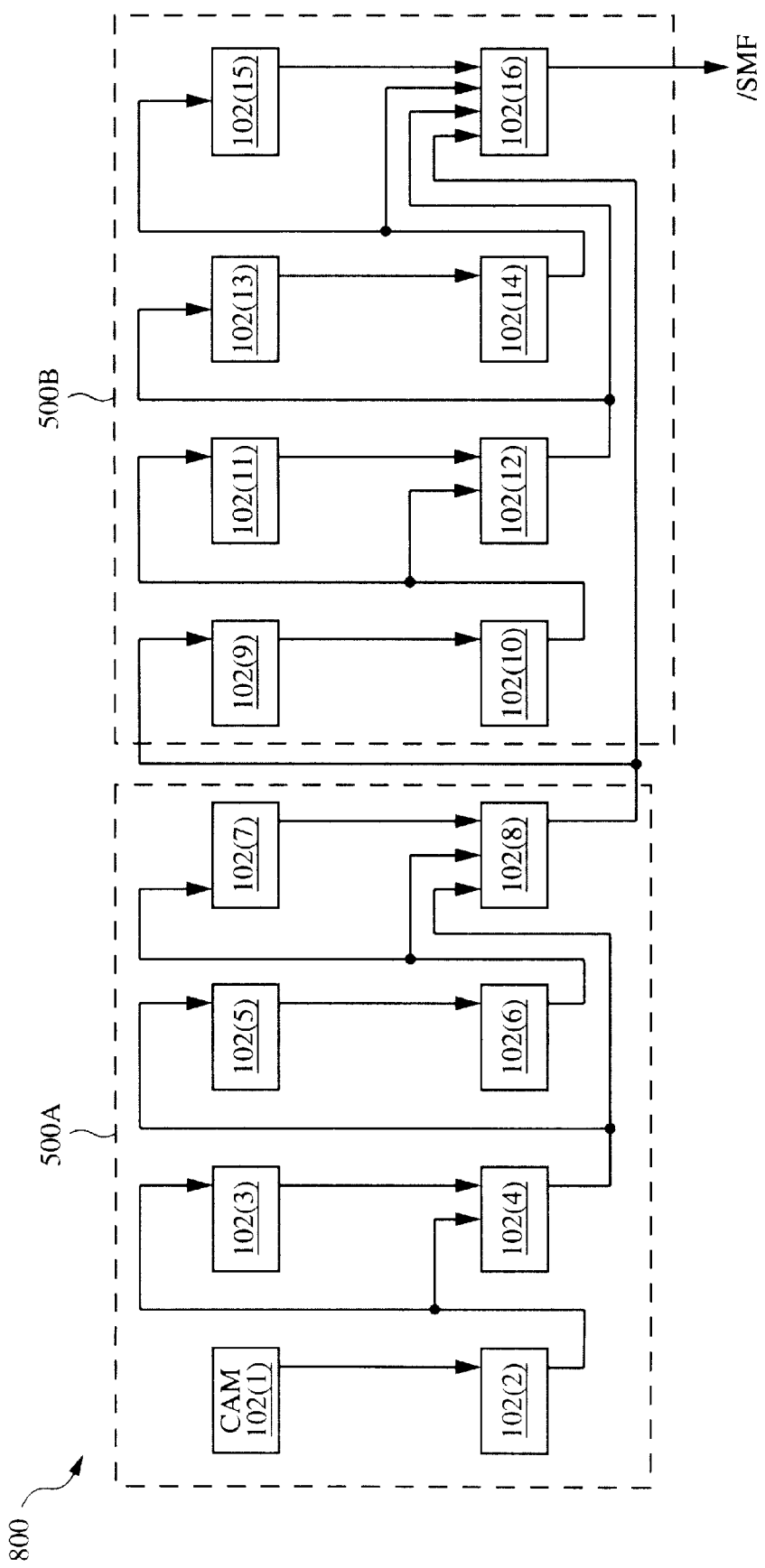
FIG. 8 is a block diagram illustrating selective cascade interconnections between sixteen CAM devices in one embodiment of the system of FIG. 1.

Present embodiments are easily adaptable to cascade larger numbers of devices. Doubling the number of devices cascaded in accordance with present embodiments requires an additional match flag input pin, and adds a delay of approximately α in generating the system match flag. In one embodiment, to double the number of cascaded devices from 8 to 16, the configuration of 8 devices shown in FIG. 5 is replicated to form two groups of eight devices in a fourth hierarchical level. The match flag output from the first group, which indicates match conditions in the first 8 devices, is provided to a match flag input pin of the first and last device in the second group of 8 devices. For example, FIG. 8 shows a cascade configuration 800 of 16 CAM devices 102 in accordance with one embodiment of the present invention. Two groups 500A and 500B are defined to each include 8 CAM devices 102. Match information is combined within the higher-priority group 500A to generate at the match flag output pin /MFO of CAM device 102(8) a group match flag indicative of match conditions in the first group 500A. The group match flag for group 500A is provided from device 102(8) to a match flag input pin of device 102(9) and device 102(16) in group 500B, where the match flag output from the last CAM device 102(16), i.e., /SMF, is indicative of match conditions in devices 102(1)–102(16).

Figure 9:
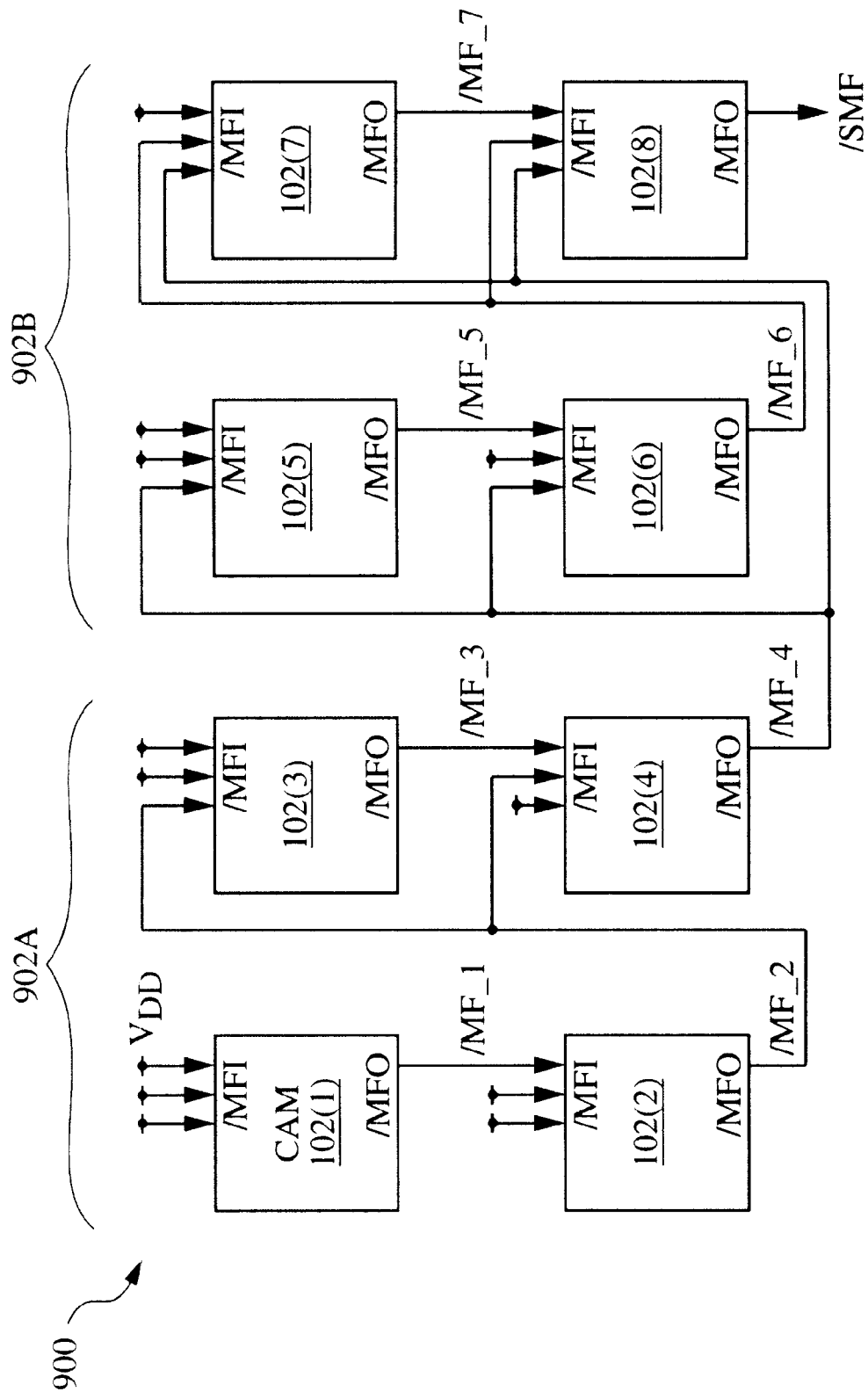
FIG. 9 is a block diagram illustrating selective cascade connections between eight CAM devices in another embodiment of the system of FIG. 1.

In other embodiments, unused match flag input pins /MFI may be coupled to receive match information from other higher-priority cascaded devices to further improve performance. For example, in the embodiment of FIG. 5, match information from group 502A devices 102(1)–102(4) ripples through each of CAM devices 102(5)–102(7) to resolve priority therein, thereby adding a gate delay of a for each device 102(5)–102(7) to resolve priority. The total delay in resolving priority for all devices 102(1)–102(8) in system 500 may be reduced by providing /MF_4 directly to devices 102(5)–102(7) via unused /MFI pins. Thus, in some embodiments, match information from a first of a pair of groups in a hierarchical level is provided to each device in a second group of the pair. For example, FIG. 9 shows a system 900 that is a modified embodiment of the system 500 of FIG. 5. System 900 includes CAM devices 102(1)–102(4) in a first group 902A and CAM devices 102(5)–102(8) in a second group 902B. Match information from group 902A devices 102(1)–102(4) is provided to all group 902B devices 102(5)–102(8) by connecting the /MFO pin of device 102(4) to respective /MFI pins of devices 102(5)–102(8).

Referring also to FIG. 10, at time to, CLK transitions to a logic high state enabling CAM devices 102(1)–102(8) to load an instruction from IBUS and comparand data from CBUS (see also FIG. 1). MF_PC is pulsed to logic high to pre-charge all /MFO pins to logic high, and DBUS_EN is de-asserted to logic low to prevent devices 102 from accessing DBUS. Each CAM device 102(1)–102(8) simultaneously compares the comparand word with entries its array 203. By time t1, each CAM device 102 in the system 900 has generated an internal match flag /MF_int in response to the compare operation. The time lapsed between times t0 and t1 is the match flag delay $t_{mf}$. At time t1, priority is resolved only for the highest-priority device 102(1), as indicated by the steady state of /MF1 in FIG. 10.

By time t2, /MF_1 has been combined in device 102(2) with its internal match flag /MF_int to update /MF_2, which now indicates whether a match condition exists in either device 102(1) and 102(2). Since /MF_2 now includes match information from all higher-priority devices, i.e., 102(1), priority is resolved in CAM device 102(2), and /MF_2 is therefore now in a steady state, as indicated in FIG. 10. However, since the steady state /MF_2 has not yet been combined in any lower priority devices 102(3)–102(8), priority is not yet resolved in devices 102(3)–102(8). The time lapsed between times t1 and t2 is approximately equal to the gate delay α of the cascade logic circuit 204. Thus, $t2=t1+\alpha=t_{mf}+\alpha$.

By time t3, /MF_2 has been combined in devices 102(3) and 102(4) with their respective internal match flags /MF_int to update respective output match flags /MF_3 and /MF_4. Thus, /MF_4 now indicates whether a match condition exists in any of devices 102(1)–102(4). Priority is also resolved in devices 102(3) and 102(4) at time t3, as indicated in FIG. 10 by the steady states of /MF_3 and /MF_4. The time lapsed between times t2 and t3 is approximately equal to α where $t3=t_{mf}+2\alpha$.

By time t4, /MF_4 has been provided to and simultaneously combined with other match information in each device 102(5)–102(8) to update match flags /MF_5 to /MF_8, respectively. /MF_8 now indicates whether a match exists in any device 102(1)–102(8) in the system 900, and is provided as the system match flag /SMF. Further, since match information from devices 102(1)–102(4) is simultaneously provided to devices 102(5)–102(8), priority is resolved for devices 102(5)–102(8) by time t4, as indicated by the steady states of /MF_5 to /MF_8 in FIG. 10.

The time lapsed between times t3 and t4 is approximately equal to α where $t4=t_{mf}+3\alpha$. DBUS_EN is asserted to logic high at time t4 to enable the buffer 206 of the highest-priority CAM device 102 having a match condition to provide the address of that match condition, along with any associated data and/or status information, to DBUS.

Figure 11:
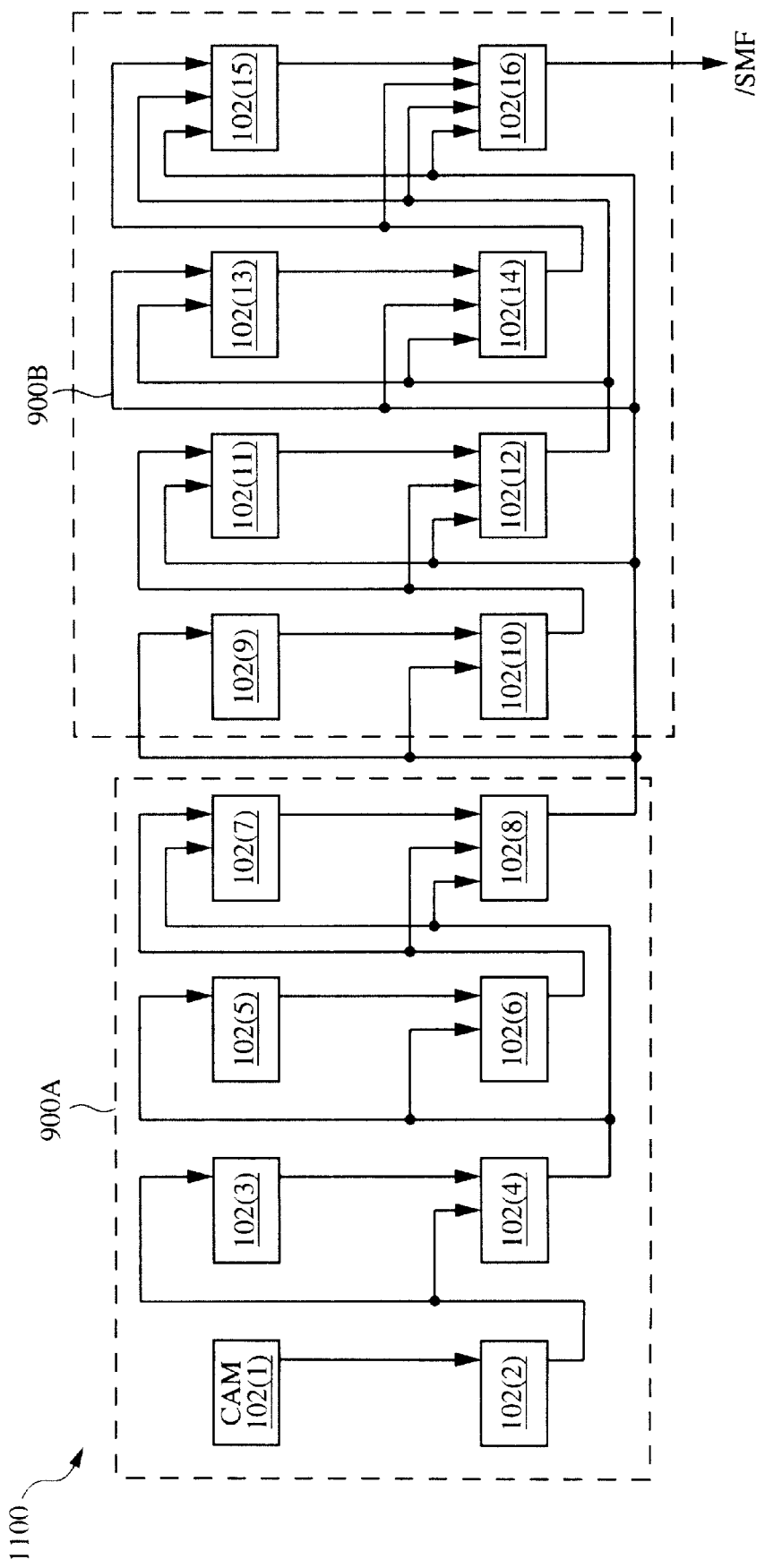
FIG. 11 is a block diagram illustrating selective cascade connections between sixteen CAM devices in another embodiment of the system of FIG. 1.

The embodiment of FIG. 9 may be replicated to form a system of 16 cascaded CAM devices 102. For example, FIG. 11 shows a system 1100 having two groups 900A and 900B cascaded together in a hierarchical manner according to the present invention. Group 900A includes CAM devices 102(1)–102(8), and group 900B includes CAM devices 102(1)–102(8). Each CAM device 102 in system 1100 includes four /MFI pins. In the embodiment of FIG. 11, the match flag output from the higher-priority group 902A is provided to each device in the lower-priority group 902B. That is, the /MFO pin of device 102(8) is coupled to an /MFI pin of each device 102(9)–102(16). The /MFO of the last device 102(16) provides the system match flag /SMF. Match information is combined within each group 900A and 900B in the manner described above with respect to FIG. 9. Thus, by time $t=t_{mf}+3\alpha$, priority is resolved in devices 102(1)–102(8), and device 102(8) provides a match flag indicative of match conditions in devices 102(1)–102(8), as described above. Similarly, priority is resolved between devices 102(9)–102(16) by time $t=t_{mf}+3\alpha$. Match information from group 900A is simultaneously provided to and combined with other match information from within group 900B in each device 102(9)–102(16) in group 900B. Thus, by time $t=t_{mf}+4\alpha$, priority is resolved for all devices 102(1)–102(16), and the system match flag /SMF is valid to indicate match conditions in devices 102(1)–102(16) by t4. Accordingly, doubling the number of devices cascaded in accordance with the present increases the time required to resolve priority and to generate the system match flag by only the gate delay a. In these embodiments, e.g., the embodiments of FIGS. 9 and 11, the relationship between the number of cascaded devices and the time required to generate the system match flag and resolve priority may be expressed as $t(n)=t_{mf}+m\alpha$ using m input pins for each device, where $m=\log_2 n$.

Figure 12:
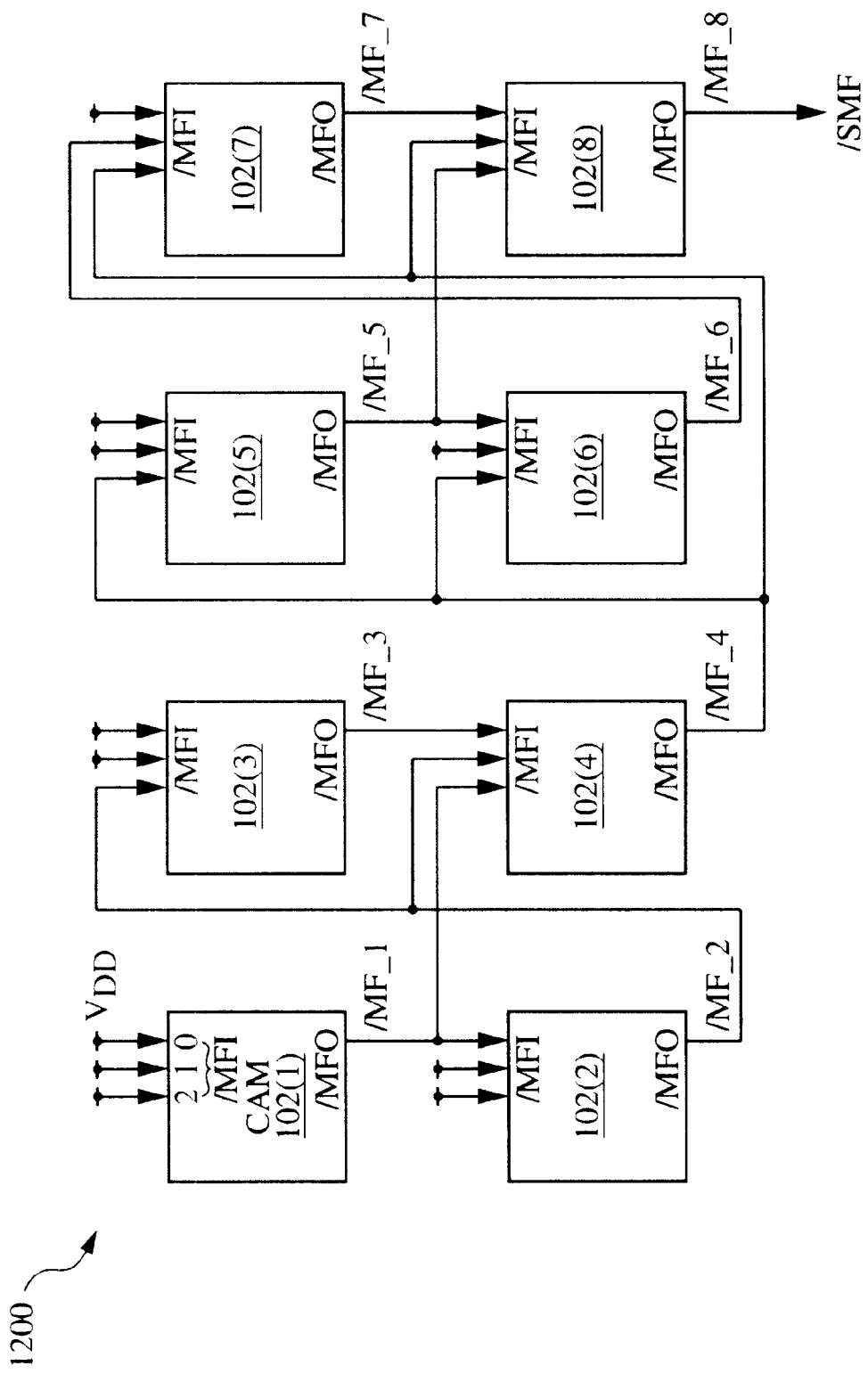
FIG. 12 is a block diagram illustrating selective cascade connections between eight CAM devices in yet another embodiment of the system of FIG. 1.

An alternate embodiment 1200 of the present invention is shown in FIG. 12 for eight CAM devices 102(1)–102(8) that generates the system match flag /SMF in a time $t=t_{mf}+2\alpha$, and resolves priority in a time $t=t_{mf}+2\alpha$. Each device 102 includes 3 /MFI pins, /MFI(0), /MFI(1), and /MFI(2), and an /MFO pin. The /MFO pin of device 102(1) is coupled to /MFI pins of devices 102(2) and 102(4). The /MFO pin of device 102(2) is coupled to /MFI pins of devices 102(3) and 102(4). The /MFO pin of device 102(3) is coupled to an /MFI pin of device 102(4). The /MFO pin of device 102(4) is coupled to /MFI pins of devices 102(5), 102(6), 102(7), and 102(8). The /MFO pin of device 102(5) is coupled to /MFI pins of devices 102(6) and 102(8). The /MFO pin of device 102(6) is coupled to an /MFI pin of device 102(7). The /MFO pin of device 102(7) is coupled to an /MFI pin of device 102(8).

Referring also to FIG. 13, at time t0, CLK transitions to a logic high state enabling CAM devices 102(1)–102(8) to load an instruction from IBUS and comparand data from CBUS (see also FIG. 1). MF_PC is pulsed to logic high to pre-charge all /MFO pins to logic high, and DBUS_EN is de-asserted to logic low to prevent devices 102 from accessing DBUS. Each CAM device 102(1)–102(8) simultaneously compares the comparand word with entries its array 203. By time t1, each CAM device 102 in the system 1200 has generated an internal match flag /MF_int in response to the compare operation. The time lapsed between times t0 and t1 is the match flag delay $t_{mf}$. As explained above, at time t1, priority is resolved only for the highest-priority device 102(1), as indicated by the steady state of /MF1.

By time t2, /MF_1 has been combined in device 102(2) with its internal match flag /MF_int to update /MF_2, which now indicates whether a match condition exists in either device 102(1) and 102(2). Since /MF_2 now includes match information from all higher-priority devices, i.e., 102(1), priority is resolved in CAM device 102(2), and /MF_2 is therefore now in a steady state, as indicated in FIG. 10. Also, by time t2, device 102(4) has combined match information from all higher-priority devices 102(1)–102(3) with its internal match flag /MF_int, and therefore has resolved priority by time t2, as indicated in FIG. 13. Also, by time t2, /MF_4 is valid to indicate match conditions in all devices 102(1)–102(4). However, since device 102(3) has not yet received match information from device 102(1), priority is not yet resolved for device 102(3). The time lapsed between times t1 and t2 is approximately equal to the gate delay α of the cascade logic circuit 204. Thus, t2=t1+α=$t_{mf}$+α.

In other embodiments, /MFO of device 102(1) may be connected to /MFI of device 102(3) such that /MF_3 is stable by time t2. Additionally, /MFO of device 102(5) may be connected to /MFI of device 102(7). In these embodiments, each lowest-priority CAM device within a group has an /MFI pin connected to an /MFO pin of each higher-priority CAM device within the group.

By time t3, match information from device 102(1) has passed through device 102(2) and been combined in device 102(3) with its /MF_int to resolve priority in device 102(3), as indicated by the steady state of /MF_3 in FIG. 10. Also, by time t3, the steady state /MF_4 has been combined in each lower priority devices 102(5)–102(8) with their respective internal match flags /MF_int. Thus, since match information from devices 102(1)–102(4) is simultaneously provided to devices 102(5)–102(8), priority is resolved for devices 102(5)–102(8) by time t3, as indicated by the steady state of match flags /MF_5 to /MF_8 in FIG. 13. Further, by time t3, /MF_8 is valid to indicate match conditions in all devices 102(1)–102(8). The time lapsed between times t2 and t3 is approximately equal to α, where t3=$t_{mf}$+2α.

In the embodiment of FIG. 12, the relationship between the number of cascaded devices and the time required to generate the system match flag and resolve priority may be expressed as t(n)=$t_{mf}$+(m−1)α using m input pins for each device, where m=$\log_2$n. For example, DBUS_EN may be asserted to logic high at time t3=$t_{mf}$+2α to enable the buffer 206 of the highest-priority CAM device 102 having a match condition to provide the address of that match condition, along with any associated data and/or status information, to DBUS. Thus, the embodiment of FIG. 12 may resolve priority in the eight devices 102(1)–102(8) approximately one α delay faster than the embodiment of FIG. 9. This allows the embodiment of FIG. 12 to operate at a higher frequency than the embodiment of FIG. 9.

Figure 14:
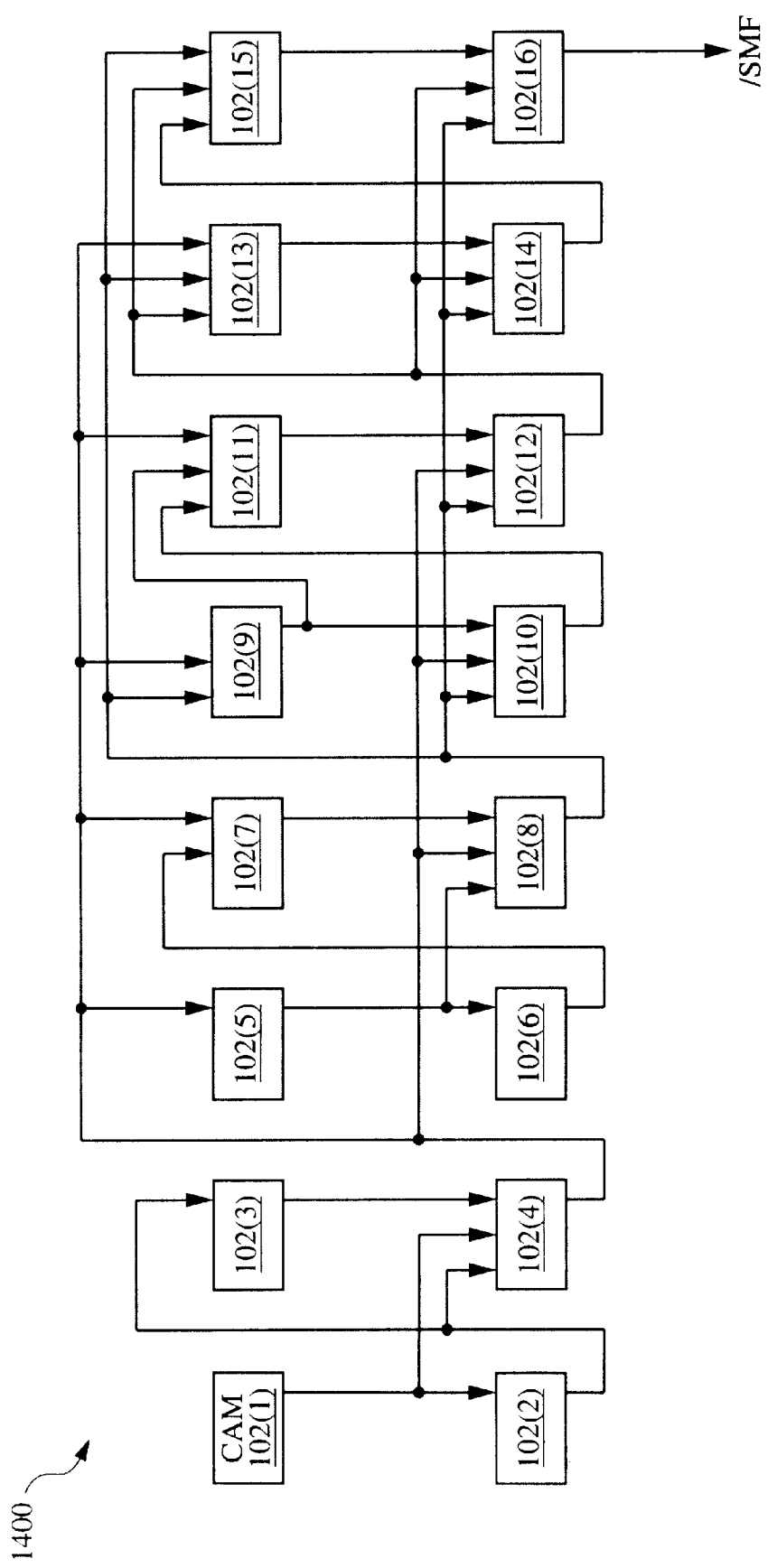
FIG. 14 is a block diagram illustrating selective cascade connections between sixteen CAM devices in still another embodiment of the system of FIG. 1.

An alternate embodiment 1400 of the present invention is shown in FIG. 14 for sixteen devices 102(1)–102(16) that generates the system match flag /SMF in a time t=$t_{mf}$+3α, and resolves priority in a time t=$t_{mf}$+3α. Each device 102 includes 3 /MFI pins. The /MFO pin of device 102(1) is coupled to /MFI pins of devices 102(2) and 102(4). The /MFO pin of device 102(2) is coupled to /MFI pins of devices 102(3) and 102(4). The /MFO pin of device 102(3) is coupled to an /MFI pin of device 102(4). The /MFO pin of device 102(4) is coupled to /MFI pins of devices 102(5), 102(7), 102(8), 102(9), 102(10), 102 (11), 102(12), and 102 (13). The /MFO pin of device 102(5) is coupled to /MFI pins of devices 102(6) and 102(8). The /MFO pin of device 102(6) is coupled to an /MFI pin of device 102(7). The /MFO pin of device 102(7) is coupled to an /MFI pin of device 102(8). The /MFO pin of device 102(8) is coupled to /MFI pins of devices 102(9), 102(10), 102(12), 102(13), 102(14), 102(15), and 102(16). The /MFO pin of device 102(9) is coupled to /MFI pins of devices 102(10) and 102(11). The /MFO pin of device 102(10) is coupled to an /MFI pin of device 102(11). The /MFO pin of device 102(11) is coupled to an /MFI pin of device 102(12). The /MFO pin of device 102(12) is coupled to /MFI pins of devices 102(13), 102(14), 102(15), and 102(16). The /MFO pin of device 102(13) is coupled to an /MFI pin of device 102(14). The /MFO pin of device 102(14) is coupled to an /MFI pin of device 102(15). The /MFO pin of device 102(15) is coupled to an /MFI pin of device 102(16), and the /MFO pin of device 102(16) provides the system match flag /SMF.

Figure 15:
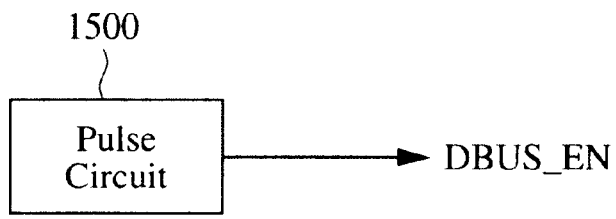
FIG. 15 is a block diagram of a pulse circuit to generate a data bus enable signal in one embodiment of the present invention.
Figure 16:
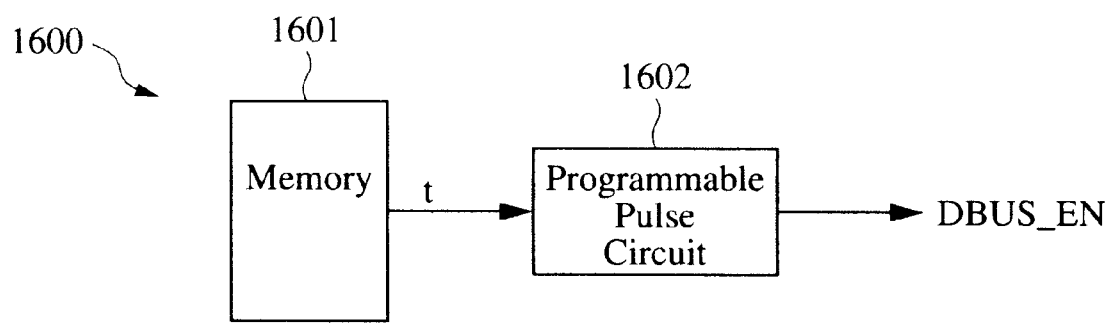
FIG. 16 is a block diagram of a pulse circuit to generate a data bus enable signal in another embodiment of the present invention.
Figure 17:
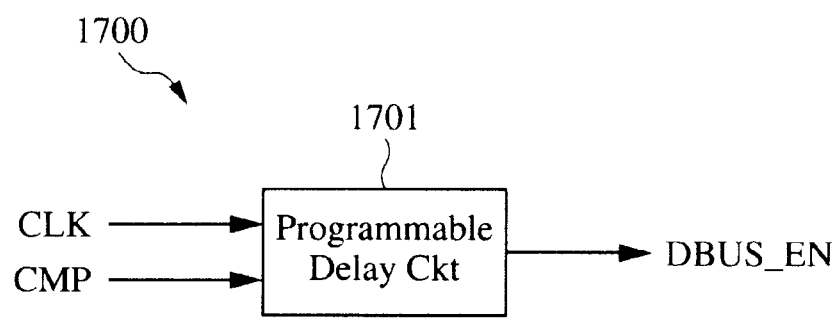
FIG. 17 is a block diagram of a programmable delay circuit to generate a data bus enable signal in yet another embodiment of the present invention.

FIGS. 15, 16, and 17 show non-exhaustive exemplary embodiments of generating DBUS_EN. Each embodiment may be included within or located outside of cascade logic 204.

FIG. 15 shows a pulse circuit 1500 that provides DBUS_EN in one embodiment of the present invention. Pulse circuit 1500 may be a well-known circuit that provides a logic high pulse for DBUS_EN to enable a selected CAM device to access DBUS. For each embodiment, pulse circuit 1500 is configured to pulse DBUS_EN to logic high for a predetermined time period when priority has been resolved for all cascaded devices in the system, as described above. For example, referring also to system 500 of FIG. 5 and the corresponding timing diagram of FIG. 7, pulse circuit 1500 may be used with system 500 to pulse DBUS_EN to logic high at time t6, since as described above priority is resolved for all devices 102(1)–102(8) in system 500 by time t6. For one example, DBUS_EN may be pulsed for approximately 2–10 ns, although other pulse widths may be used. In one embodiment, pulse circuit 1500 may be a well-known one-shot circuit.

For alternate embodiments, DBUS_EN may be pulsed after the instruction is decoded and may be de-asserted after time t6 in FIG. 7, time t4 in FIG. 10, or time t3 in FIG. 13. For this embodiment, logic 300 of FIG. 3 may be altered such that AND gate 310 receives the logical complement of DBUS_EN.

FIG. 16 shows a circuit 1600 that is one embodiment of the pulse circuit 1500 of FIG. 15 which allows for a programmable DBUS_EN signal. Circuit 1600 includes a memory table 1601 and a programmable pulse circuit 1602. Memory 1601 may be a conventional look-up table or other suitable memory device that stores one or more delay values for programmable pulse circuit 1601. During a compare operation, memory 1601 provides a delay value Δt to programmable pulse circuit 1602 which corresponds to the time required to resolve priority in all devices of the associated system of the present invention. In response thereto, programmable pulse circuit 1602 pulses DBUS_EN to logic high approximately Δt after the beginning of the compare operation, i.e., at a time t=t0+Δt, to allow the highest-priority CAM device 102 having a match condition to access DBUS. For example, when used to assert DBUS_EN for system 500 of FIG. 5, memory 1601 may provide a Δt=$t_{mf}$+5α to programmable pulse circuit 1602 so that programmable pulse circuit asserts DBUS_EN at time t6 (see also FIG. 7). In one embodiment, a select signal may be provided to memory 1601 to select which of the plurality of delay values Δt is provided to programmable pulse circuit 1602. In this manner, a user may selectively program when circuit 1600 asserts DBUS_EN based upon the desired cascade configuration and/or desired operating frequency.

FIG. 17 shows a circuit 1700 that is another embodiment of the pulse circuit 1500 of FIG. 15. Circuit 1700 includes a programmable delay circuit 1701 that delays CLK by a predetermined factor to generate DBUS_EN. In this manner, circuit 1700 provides a DBUS_EN signal that is directly related to CLK. Programmable delay circuit 1701 may be operative to delay CLK in response to control signal CMP that indicates a compare instruction and may be provided by an instruction decoder or other control logic. Programmable delay circuit 1701 may be any programmable delay circuit such as a series of latches, registers, fuses, or other programmable memory elements.

Referring again to system 500 of FIG. 5, for each device 102(1)–102(8), since match information received from higher-priority devices 102 via respective /MFI pins is necessary to determine priority, match information from all higher-priority devices 102 is combined to generate the enable signal EN for buffer 206 (see also FIG. 2). However, since match information from higher-priority devices 102 may bypass selected lower-priority devices to generate the system match flag /SMF, as described above with respect to FIGS. 5 and 7, some devices 102 may not need to combine match information from higher-priority devices when generating the output match flag /MF at /MFO. For example, since match information from devices 102(1) and 102(2) is provided directly to device 102(4), the match information does not need to ripple through device 102(3) in order to reach device 102(4). Accordingly, although device 102(3) requires match information from devices 102(1) and 102(2) to resolve priority for asserting EN, device 102(3) does not need to combine match information from higher-priority devices 102(1) and 102(2) to generate /MF_3. Thus, for the purpose of generating a group or system match flag at the earliest time, the /MFI inputs to CAM 102(3) can be ignored to generate /MFO (but not ignored to generate EN for priority purposes).

Figure 18:
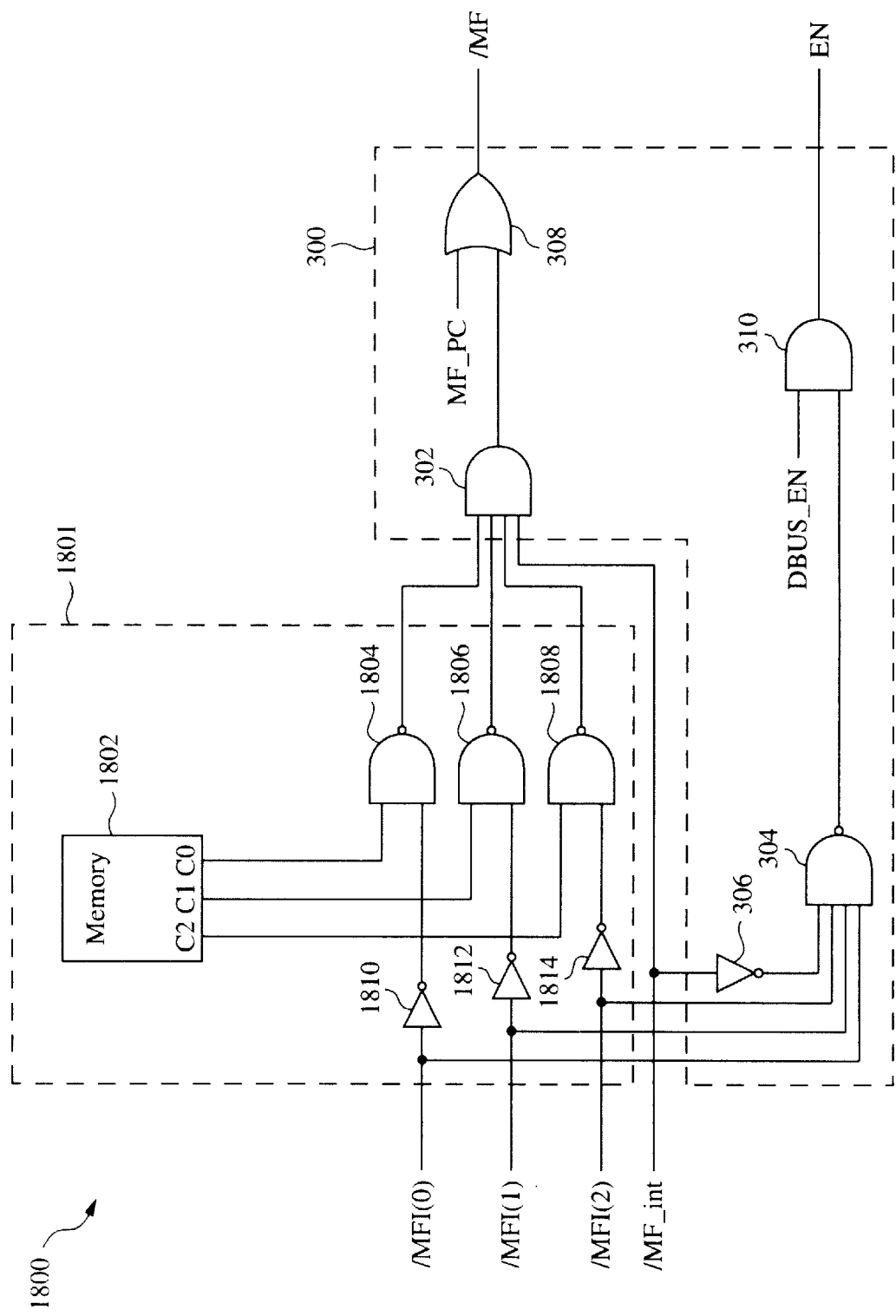
FIG. 18 is a logic diagram of another embodiment of the cascade logic circuit of the CAM device of FIG. 2.

FIG. 18 shows a cascade logic circuit 1800 that is another embodiment of cascade logic circuit 204 which allows for match information from higher-priority devices 102 to be selectively combined with a device's own internal match flag /MF_int to generate /MF. Cascade logic circuit 1800 is discussed below in the context of exemplary embodiments disclosed above for simplicity only; it is to be understood that cascade logic circuit 1800 may be used with any embodiment of the present invention. Cascade logic circuit 1800 includes select logic 1801 and cascade logic circuit 300 of FIG. 3. Cascade logic circuit 300 combines match information from higher-priority devices 102 received via /MFI(0), /MFI(1), and /MFI(2) with the /MF_int signal from a corresponding CAM array 203 in AND gate 304 to generate EN (when DBUS_EN is asserted), as described above with respect to FIG. 3.

Select logic 1801 includes a memory 1802, NAND gates 1804, 1806, and 1808, and corresponding inverters 1810, 1812, and 1814. Memory 1802 stores select values C0, C1, and C2 that are used to selectively gate match information from higher-priority devices 102 provided via match flag input pins /MF(1), /MF(2), and /MF(3), respectively. Memory 1802 may be any suitable memory device including, for example, EPROM, EEPROM, SRAM, or a register. In one embodiment, memory 1801 may be a look-up table that is shared by cascade logic circuits 1801 of each cascaded CAM device 102.

NAND gates 1804, 1806, and 1808 each have a first input terminal coupled to /MFI(0), /MFI(1), and /MFI(2), respectively, via corresponding inverters 1810, 1812, and 1814, a second input terminal to receive select values C0, C1, and C2, respectively, and an output terminal coupled to a corresponding input terminal of AND gate 302. AND gate 302 combines the selected match information from higher-priority devices 102 with the /MF_int signal from associated array 203 to generate /MF via OR gate 308. As described above with respect to FIG. 3, the MF_PC signal provided to the other input terminal of OR gate 308 may be used to pre-charge /MF to logic high during compare operations. Alternatively, MF_PC and OR gate 308 may be omitted.

The select values C0, C1, and C2 control whether signals /MFI(0), /MFI(1), and /MFI(2) participate in generating the output match flag /MF by selectively gating the /MFI(0), /MFI(1), and /MFI(2) signals. In one embodiment, a logic low select value C prevents the corresponding /MFI signal from participating in generating /MF by forcing the corresponding NAND gate 1804, 1806, or 1808 output to logic high. Conversely, a logic high select value C allows the corresponding /MFI signal to participate in generating /MF by passing the /MFI signal to AND gate 302, which asserts /MF to logic low to indicate a match condition if any of signals /MFI(0), /MFI(1), /MFI(2), or /MF_int are logic low.

Thus, for example, when C0 is set to logic low or "0", NAND gate 1804 provides a logic one to AND gate 302 to indicate a mismatch condition from signal /MFI(0), irrespective of whether /MFI(0) is logic high or logic low. By forcing a mismatch for signal /MFI(0), select logic 1801 prevents /MFI(0) from participating in generating /MF. Conversely, when C0 is set to logic high or "1", NAND gate 1804 and inverter 1810 together pass the logic state of /MFI(0) to AND gate 302, thereby allowing /MFI(0) to participate in generating /MF. Note that when C0=0, /MFI(0) is inverted by inverter 1810, and then inverted again by NAND gate 1804.

In embodiments where each CAM device 102 includes cascade logic 1800, each CAM device 102 may be individually configured to selectively allow or preclude match signals received at its /MFI pins to participate in generating system match information while preserving a path through the system to determine priority. The ability to individually configure each CAM device 102 in this manner may allow the /MFO pin of some CAM devices 102 to achieve a steady state sooner than in previously described embodiments by not allowing match information from higher-priority devices 102 from subsequently toggling the /MFO pin as match information ripples through the CAM devices. For example, referring to system 1200 shown in FIG. 12, since match information from device 102(1) and 102(2) is provided directly to device 102(4), it does not need to ripple through device 102(3) to reach device 102(4) to generate /MF_4. Accordingly, the select values C0, C1, and C2 corresponding to device 102(3) may be set to "0" to force NAND gates 1804, 1806, and 1808 to logic "1", regardless of the logic states /MFI(0), /MFI(1), and MFI(2), respectively. Once /MF is set to either logic high or logic low in response to /MF_int via AND gate 302, match information rippled from devices 102(1) and/or 102(2) cannot change /MF, thereby allowing /MF to achieve a steady state as soon as /MF_int propagates through AND gate 302 and OR gate 308. In contrast, without cascade logic circuit 1800 operating to gate device 102(3)'s /MFI pins, match information rippling from devices 102(1) and 102(2) may unnecessarily toggle device 102(3)'s /MFO pin, which in turn may cause undesirable voltage spikes or noise. In this manner, the select values C0, C1, and C2 for a CAM device 102 selectively combine match flags received from other CAM devices with the CAM device's internal match flag to generate the CAM device's output match flag. Table 1 below summarizes the select values C0, C1, and C2 for devices 102(1)–102(8) in one embodiment of system 1200 of FIG. 12, where x=a don't care state.

TABLE 1

| Device | C2 | C1 | C0 |
| --- | --- | --- | --- |
| 102 (1) | x | x | x |
| 102 (2) | x | x | 1 |
| 102 (3) | 0 | x | x |
| 102 (4) | 1 | 1 | 1 |
| 102 (5) | 0 | x | x |
| 102 (6) | 0 | x | 1 |
| 102 (7) | 0 | 1 | x |
| 102 (8) | 1 | 1 | 1 |

In other embodiments, memory 1802 is a look-up table that stores select values C0, C1, and C2 for each cascaded CAM device 102. Each CAM device is assigned an unique device ID, which in turn is used to retrieve corresponding select values C0, C1, and C2 from the look-up table to determine which match flags received from other devices (if any) participate in generating the CAM device's output match flag. The device ID values may be used to indicate priority between the cascaded CAM devices, where device ID="000" indicates the highest-priority device in the system. For example, table 2 shows the select values C0, C1, and C2 for corresponding device ID values stored in a look-up table format for one embodiment of system 1200 of FIG. 12.

TABLE 2

| Device ID | | | C2 | C1 | C0 |
| --- | --- | --- | --- | --- | --- |
| 0 | 0 | 0 | x | x | x |
| 0 | 0 | 1 | x | x | 1 |
| 0 | 1 | 0 | 0 | x | x |
| 0 | 1 | 1 | 1 | 1 | 1 |
| 1 | 0 | 0 | 0 | x | x |
| 1 | 0 | 1 | 0 | x | 1 |
| 1 | 1 | 0 | 0 | 1 | x |
| 1 | 1 | 1 | 1 | 1 | 1 |

The select values of Tables 1 and 2 may change for each different embodiment of interconnections between cascaded devices. In general, for a given CAM device under study, a particular /MFI input can be ignored or disabled for generating /MFO of the device if (i) the match flag signal for that input is also connected to a lower-priority device (other than the device under study), and (ii) the next immediate lower-priority device does not have a direct or indirect connection on all of its /MFI inputs to the /MFO pins of all the previous devices excluding the device under study.

As indicated above, the cascading schemes described herein can also be used to cascade other flags or control signals indicative of the operating state of a CAM device. For one example, a multiple match flag signal may be generated by multiple match flag logic from the match lines of a CAM array and propagated through multiple match input and output pins of each CAM device to generate a system multiple match flag. For one embodiment, each multiple match flag output may be provided to a multiple match input of the last device in a group, and the group multiple match flag provided to the lowest-priority device in the next group. If there are not enough available multiple match flag inputs on the lowest-priority device in the next group, then one or more of the multiple match outputs in the next group may be indirectly connected to a multiple match flag input of the lowest-priority device through one of the other devices. Other embodiments may be used.

We claim:

1. A content addressable memory (CAM) device comprising:

an array including a plurality of rows of CAM cells each coupled to a match line;

match flag logic having inputs coupled to the match lines, and having an output to provide an internal match flag signal indicative of match conditions between a comparand word and data stored in the array;

a plurality of match flag inputs to receive input match information from one or more other CAM devices;

a match flag output to provide output match information to one or more other CAM devices; and cascade logic coupled to the plurality of match flag inputs and the match flag output for selecting which input match information received from the match flag inputs is logically combined with the internal match flag to generate the output match information.

2. The CAM device of claim 1, wherein the cascade logic further comprises means for forcing the output match information to a mismatch state regardless of the match conditions.

3. The CAM device of claim 1, wherein the cascade logic has an output for providing a first enable signal.

4. The CAM device of claim 3, further comprising:

a priority encoder having inputs coupled to the match lines, and having outputs to provide a match address; and an output buffer having first inputs coupled to receive the match address from the priority encoder, a second input coupled to receive the first enable signal from the cascade logic and outputs to selectively output the match address from the CAM device in response to the first enable signal.

5. The CAM device of claim 4, wherein the cascade logic further comprises means for generating a second enable signal, wherein the first enable signal is gated by the second enable signal.

6. The CAM device of claim 5, wherein the means for generating the second enable signal comprises a pulse circuit.

7. The CAM device of claim 5, wherein the means for generating the second enable signal comprises a programmable delay circuit.

8. The CAM device of claim 5, wherein the means for generating the second enable signal comprises:

a memory circuit; and a programmable pulse circuit coupled to the memory circuit.

9. The CAM device of claim 1, wherein the input match information includes one or more input match flags indicative of match conditions in one or more other CAM devices.

10. The CAM device of claim 9, wherein the cascade logic comprises:

a memory element to store one or more select values; and one or more first logic circuits each having a first input coupled to receive a corresponding input match flag, a second input coupled to receive a corresponding select value, and an output to selectively provide the corresponding input match flag in response to the corresponding select value.

11. The CAM device of claim 10, wherein the cascade logic further comprises:
   a second logic circuit having one or more first inputs coupled to the outputs of the one or more first logic circuits, a second input coupled to receive the internal match flag, and an output to provide the output match information.

12. The CAM device of claim 11, wherein the first logic circuits comprise AND logic gates, and the second logic circuit comprises an OR logic gate.

13. The CAM device of claim 11, wherein the cascade logic further comprises:
   a third logic circuit having one or more first inputs coupled to receive the one or more input match flags, a second input coupled to receive the internal match flag, and an output to generate an enable signal.

14. The CAM device of claim 10, wherein the memory element comprises a look-up table having a plurality of rows for storing the one or more select values.

15. The CAM device of claim 14, wherein a first row comprises a first portion for storing a device identification (ID) of the CAM device and a second portion for storing a first one of the select values corresponding to the CAM device, and a second row comprises a first portion for storing a device ID of one of the other CAM devices and a second portion for storing a second one of the select values corresponding to the one of the other CAM devices.

16. The CAM device of claim 15, wherein the device ID of the CAM device indicates priority relative to the device ID of the one of the other CAM devices.

17. A content addressable memory (CAM) device comprising:
   an array including a plurality of rows of CAM cells each coupled to a match line;
   match flag logic having inputs coupled to the match lines, and having an output to provide an internal match flag signal indicative of match conditions between a comparand word and data stored in the array;
   one or more match flag inputs to receive input match information from one or more other CAM devices;
   a match flag output to provide output match information to one or more other CAM devices; and
   programmable cascade logic coupled to the one or more match flag inputs and the match flag output.

18. The CAM device of claim 17, wherein the programmable cascade logic further comprises means for forcing the output match information to a mismatch state.

19. The CAM device of claim 17, wherein the programmable cascade logic comprises means for determining when to allow a logical combination of the input match information and the internal match flag signal to assert an output enable signal.

20. The CAM device of claim 17, wherein the programmable cascade logic has an output for providing a first enable signal.

21. The CAM device of claim 20, further comprising:
   a priority encoder having inputs coupled to the match lines, and having outputs to provide a match address; and
   an output buffer having first inputs coupled to receive the match address from the priority encoder, a second input coupled to receive the first enable signal from the programmable cascade logic and outputs to selectively output the match address from the CAM device in response to the first enable signal.

22. The CAM device of claim 21, wherein the programmable cascade logic comprises means for determining when to assert the first enable signal.

23. The CAM device of claim 21, wherein the programmable cascade logic further comprises means for generating a second enable signal, wherein the first enable signal is gated by the second enable signal.

24. The CAM device of claim 23, wherein the means for generating the second enable signal comprises a programmable delay circuit.

25. The CAM device of claim 23, wherein the means for generating the second enable signal comprises:
   a memory circuit; and
   a programmable pulse circuit coupled to the memory circuit.

26. A method for selectively combining match information in a content addressable memory (CAM) device, the method comprising:
   generating an internal match flag indicative of match conditions in the CAM device;
   receiving input match information from one or more other CAM devices;
   storing one or more select values in the CAM device; and
   selectively enabling, in response to the one or more select values, the input match information to be logically combined with the internal match flag to generate output match information.

27. The method of claim 26, wherein the input match information includes one or more input match flags received from one or more other corresponding CAM devices, the selectively enabling comprising, for each input match flag:
   combining the input match flag with the internal match flag to generate the output match information if the corresponding select value is in a first state; and
   providing the internal match flag as the output match information if the corresponding select value is in a second state.

28. The method of claim 26, further comprising:
   determining an address of a CAM row in the CAM device that stores data matching a comparand word; and
   outputting the match address from the CAM device only after the output match information from other CAM devices has been resolved.

29. The method of claim 28, further comprising:
   programming when to output the match address.

30. A method for selectively combining match information in one or more of a plurality of content addressable memory (CAM) devices, the method comprising:
   generating an internal match flag indicative of match conditions in a corresponding CAM device;
   receiving input match information from another CAM device;
   storing a select value;
   combining the input match information with the internal match flag to generate output match information if the select value is in a first state; and
   providing the internal match flag as the output match information, and ignoring the input match information, if the select value is in a second state.

31. The method of claim 30, further comprising asserting the select value for the corresponding CAM device to the second state only when (i) the input match information is provided to a lower-priority CAM device other than the corresponding CAM device and (ii) the next immediate lower-priority CAM device does not receive input match information from all higher-priority CAM devices other than the corresponding CAM device.

32. A content addressable memory (CAM) device comprising:
- an array including a plurality of rows of CAM cells each coupled to a match line;
- match flag logic having inputs coupled to the match lines, and having an output to provide an internal match flag signal indicative of match conditions between a comparand word and data stored in the array;
- one or more match flag inputs to receive one or more input match flags indicative of match conditions in one or more other CAM devices;
- a match flag output to provide output match information to one or more other CAM devices; and
- cascade logic coupled to the one or more match flag inputs and the match flag output for selectively enabling the one or more input match flags on the one or more match flag inputs to be logically combined with the internal match flag to generate the output match information, the cascade logic comprising:
  - a memory element to store one or more select values; and
  - one or more first logic circuits each having a first input to receive a corresponding input match flag, a second input to receive a corresponding select value, and an output to selectively provide the corresponding input match flag in response to the corresponding select value.

33. The CAM device of claim 32, wherein the cascade logic further comprises:
- a second logic circuit having one or more first inputs coupled to the outputs of the one or more first logic circuits, a second input to receive the internal match flag, and an output to provide the output match information.

34. The CAM device of claim 33, wherein the first logic circuits comprise AND logic gates, and the second logic circuit comprises an OR logic gate.

35. The CAM device of claim 33, wherein the cascade logic further comprises:

- a third logic circuit having one or more first inputs to receive the one or more input match flags, a second input to receive the internal match flag, and an output to generate an enable signal.

36. The CAM device of claim 32, wherein the memory element comprises a look-up table having a plurality of rows each for storing the one or more select values for a corresponding CAM device.

37. The CAM device of claim 36, wherein each row comprises a first portion for storing a device identification (ID) of the corresponding CAM device and a second portion for storing the one or more select values for the corresponding CAM device.

38. The CAM device of claim 37, wherein each device ID indicates priority for the corresponding CAM device relative to another CAM device.

39. A content addressable memory (CAM) device comprising:
- an array including a plurality of rows of CAM cells each coupled to a match line;
- match flag logic having inputs coupled to the match lines, and having an output to provide an internal match flag signal indicative of match conditions between a comparand word and data stored in the array;
- a plurality of match flag inputs to receive input match information from other CAM devices;
- a match flag output to provide output match information to one or more other CAM devices; and
- cascade logic coupled to the plurality of match flag inputs and the match flag output, the cascade logic comprising:
  - means for storing a plurality of select values, each corresponding to one of the match flag inputs; and
  - means for selectively combining the input match information with the internal match flag in response to the plurality of select values to generate the output match information.

40. The CAM device of claim 39, wherein the cascade logic further comprises:
- means for combining the input match information with the internal match flag to generate an enable signal that allows access to a common output bus.

* * * * *